US006987468B1

(12) United States Patent
Malvar

(10) Patent No.: US 6,987,468 B1
(45) Date of Patent: Jan. 17, 2006

(54) LOSSLESS ADAPTIVE ENCODING AND DECODING OF INTEGER DATA

(75) Inventor: Henrique S. Malvar, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 10/978,157

(22) Filed: Oct. 29, 2004

(51) Int. Cl.
*H03M 7/00* (2006.01)
*G06K 9/36* (2006.01)
*G06K 9/46* (2006.01)

(52) U.S. Cl. .................. 341/59; 382/232; 382/244; 382/245; 382/246

(58) Field of Classification Search ............... None
See application file for complete search history.

(56) References Cited

U.S. PATENT DOCUMENTS

| 6,300,888 | B1 * | 10/2001 | Chen et al. ............... 341/63 |
| 6,477,280 | B1 * | 11/2002 | Malvar .................. 382/245 |
| 6,650,784 | B2 * | 11/2003 | Thyagarajan ............. 382/244 |
| 6,711,295 | B2 * | 3/2004 | Nakayama et al. ......... 382/232 |
| 6,771,828 | B1 | 8/2004 | Malvar |

OTHER PUBLICATIONS

Co-pending U.S. Appl. No. 10/977,701, "Lossless Adaptive Golomb/Rice Encoding and Decoding of Integer Data Using Backward-Adaptive Rules", filed Oct. 29, 2004.
Co-pending U.S. Appl. No. 10/976,623, "Lossless Adaptive Encoding and Decoding of Integer Data", filed Oct. 29, 2004.
Langdon, Jr. G. G., "An adaptive run-length encoding alorithm," *IBM Tech. Disclosure Bulletin*, vol. 26, pp. 3783-3785, Dec. 1983.

Merhav, N., Seroussi, G. and Weinberger, M. J., "Optimal prefix codes for sources with two-sided geometric distrbutions," *IEEE Trans. Inform. Theory*, vol. 46, No. 1, pp. 121-135, Jan. 2000.
Ordentlich, E., Weinberger, M. and Seroussi, G., "A low-complexity modeling approach for embedded coding of wavelet coefficients," *Proc. Data Compression Conference*, Snowbird, Utah, pp. 408-417, Mar. 1998.
Weinberger, M. J., Seroussi, G. and Sapiro, G., "The LOCO-I lossless image compression algorithm: principles and standardization into JPEG-LS," *IEEE Trans. Image Processing*, vol. 9, pp. 1309-1324, Aug. 2000.

* cited by examiner

*Primary Examiner*—Peguy Jeanpierre
*Assistant Examiner*—Khai M. Nguyen
(74) *Attorney, Agent, or Firm*—Lyon & Harr, L.L.P.; Craig S. Fischer

(57) ABSTRACT

A method and system of lossless compression of integer data using a novel backward-adaptive technique. The adaptive Run-Length and Golomb/Rice (RLGR) encoder and decoder (codec) and method switches between a Golomb/Rice (G/R) encoder mode only and using the G/R encoder combined with a Run-Length encoder. The backward-adaptive technique includes novel adaptation rules that adjust the encoder parameters after each encoded symbol. An encoder mode parameter and a G/R parameter are adapted. The encoding mode parameter controls whether the adaptive RLGR encoder and method uses Run-Length encoding and, if so, it is used. The G/R parameter is used in both modes to encode every input value (in the G/R only mode) or to encode the number or value after an incomplete run of zeros (in the RLGR mode). The adaptive RLGR codec and method also includes a decoder that can be precisely implemented based on the inverse of the encoder rules.

40 Claims, 14 Drawing Sheets

LOSSLESS ADAPTIVE ENCODING AND DECODING OF INTEGER DATA

TECHNICAL FIELD

The present invention relates in general to the processing of digital data and more particularly to an improved method and system of lossless encoding and decoding of integer data using a novel backward-adaptive technique.

BACKGROUND OF THE INVENTION

Data compression is becoming increasingly important as the size of computer data (such as text, audio, video, image and program files) continues to grow. Data compression is a way of encoding digital data into an encoded representation that uses fewer bits than the original data. Representing the data in fewer bits means that the data occupies less storage space and requires less transmission bandwidth.

In general, data compression compresses a data by predicting the most frequently-occurring data and storing it in less space. Specifically, data compression involves at least two different tasks: (1) defining a data model to predict the probabilities of the input data; and (2) using a coder to generate codes from those probabilities. In addition, some data compression techniques mathematically transform and quantize the data to achieve even greater compression.

A compression technique may be lossless or lossy. A lossless compression technique is reversible such that the original data before encoding and the decompressed data after decoding are bit-for-bit identical. Lossy compression uses the fact there is much repetition in data that can be thrown away with much loss in quality. Lossy compression accepts the loss of some of the original data in order to achieve a higher compression.

Lossless compression typically is used to compress text or binary data, while lossy compression typically is used for audio, image and video data. However, even lossy compression techniques can sometimes use a lossless compression technique. For example, two commonly-used kinds of compression (or coding) technique are transform coding and predictive coding. For such kinds of compression systems, the original data is transformed and then quantized (rounded to nearest integers), or predicted based on (fixed or adaptive) signal models, and the prediction errors (differences between the original and predicted data) are then quantized. In both, cases, the data after quantization are in integer form. Once these integers are obtained, a lossless compression technique is used to encode the quantized values, in order to reduce the number of bits needed to represent the data.

The set of these integer values usually has an associated probability distribution function (PDF). These PDFs have a distribution such that if the data properties are well modeled by the predictor, in predictive coding, then the prediction error should be close to zero most of the time. Similarly, in transform coding, most of the quantized transform coefficients are zero. FIG. 1 illustrates a typical probability distribution for these integer values; zero is the most likely value, and the probabilities of nonzero values decrease nearly exponentially fast as the magnitude increases. The data has a probability distribution shown in FIG. 1 because the data that is being encoded using the lossless compression technique is not the original data. FIG. 1 is the integer data resulting from quantizing transform coefficients or prediction errors.

Mathematically, the problem is to find an efficient solution to encoding a vector x containing N integers. Each of the elements x(n), n=0, 1, . . . , N−1, has a value according to a probability distribution similar to that in FIG. 1, so that the most probable value is zero, and values farther away from zero have fast decreasing probabilities.

A simple mathematical model for probability distributions like the one in FIG. 1 is the Laplacian, or two-sided geometric (TSG) distribution, characterized by a parameter θ:

$$P(x, \theta) = \frac{1-\theta}{1+\theta} \theta^{|x|} \quad (1)$$

Note that the parameter θ controls the rate of decay in probability as |x| grows. The larger the value of θ, the faster the decay. The parameter θ can be directly related to the probability that x=0, that is P(0, θ)=(1−θ)/(1+θ). Also, the expected magnitude of the source symbol is:

$$E[|x|] = \frac{2\theta}{1-\theta^2} \quad (2)$$

The entropy of the source is given in bits/symbol by $$H(x) = \log_2\left(\frac{1+\theta}{1-\theta}\right) - \frac{2\theta}{1-\theta^2} \log_2(\theta) \quad (3)$$

Thus, a good encoder should map a vector of N values of x into a bitstream containing not much more than N·H(x) bits, the theoretical minimum.

The Laplacian distribution is a common model in media compression systems, for either prediction errors in predictive coders (like most lossless audio and image coders) or for quantized transform coefficients (like most lossy audio, image, and video coders).

There have been many proposed encoders for sources with a Laplacian/TSG distribution. A simple but efficient encoder is the Golomb-Rice encoder. First, the TSG source values x are mapped to nonnegative values u by the simple invertible mapping:

$$u = Q(x) = \begin{cases} 2x, & x \geq 0 \\ -2x-1, & x < 0 \end{cases} \quad (4)$$

that is equivalent to seeing u as the index to the reordered alphabet {0, −1, +1, −2, +2, . . . }. The new source u has a probability distribution that approximates that of a geometric source, for which Golomb codes are optimal, because they are Huffman codes for geometric sources, as long as the Golomb parameter is chosen appropriately.

An example of Golomb-Rice (G/R) codes is shown in Table 1 for several values of the parameter m. It should be noted that when m equals a power of two, a parameter k is used, which is related to m by m=$2^k$. The main advantage of G/R codes over Huffman codes is that the binary codeword can be computed by a simple rule, for any input value. Thus, no tables need to be stored. This is particularly useful for modern processors, for which reading from a memory location that stores a table entry can take longer than executing several instructions. It is easy to see that the parameter m determines how many consecutive codeword have the same number of bits. That also indicates that computing the codeword involves computing u/m, where u is the input value. For most processors, an integer division takes many cycles, so the G/R code for general m is not attractive. When $m=2^k$ is chosen, which corresponds to a Rice code, then the division u/m can be replaced by a shift, because u/m=u>>k (where >>denotes a right shift operator). Thus, computing the G/R code for any input u is easy; simply compute p=u>>k and v=u−(p<<k). The code is then formed by concatenating a string with p 1's with the k-bit binary representation of v.

TABLE 1

| Input value | m = 1<br>k = 0 | m = 2<br>k = 1 | m = 3 | m = 4<br>k = 2 | m = 5 | ... | m = 8<br>k = 3 |
|---|---|---|---|---|---|---|---|
| 0 | 0 | 00 | 00 | 000 | 000 | | 0000 |
| 1 | 10 | 01 | 010 | 001 | 001 | | 0001 |
| 2 | 110 | 100 | 011 | 010 | 010 | | 0010 |
| 3 | 1110 | 101 | 100 | 011 | 0110 | | 0011 |
| 4 | 11110 | 1100 | 1010 | 1000 | 0111 | | 0100 |
| 5 | 111110 | 1101 | 1011 | 1001 | 1000 | | 0101 |
| 6 | 1111110 | 11100 | 1100 | 1010 | 1001 | | 0110 |
| 7 | 11111110 | 11101 | 11010 | 1011 | 1010 | | 0111 |
| 8 | 111111110 | 111100 | 11011 | 11000 | 10110 | | 10000 |
| 9 | 1111111110 | 111101 | 11100 | 11001 | 10111 | | 10001 |
| 10 | 11111111110 | 1111100 | 111010 | 11010 | 11000 | | 10010 |
| 11 | 111111111110 | 1111101 | 111011 | 11011 | 11001 | | 10011 |
| 12 | 1111111111110 | 11111100 | 111100 | 111000 | 11010 | | 10100 |
| 13 | 1111111111110 | 11111101 | 1111010 | 111001 | 110110 | | 10101 |
| : | | : | : | : | : | | : |

It is clear from Table 1 that the choice of the G/R parameter k must depend on the statistics of the source. The slower the decay of probability as u increases, the larger k should be chosen. Otherwise, the codeword lengths grow too quickly. A simple rule for choosing k is that the codeword length for a given input value u should approximate the logarithm base 2 of the probability of occurrence of that value.

Although G/R codes are optimal for geometrically-distributed sources, they are not optimal for encoding symbols from a Laplacian/TSG source via the mapping in Equation 4. This is because for an input variable x with a TSG distribution, the variable u from Equation 4 has a probability distribution that is close to but not exactly geometric. In practice, the performance is close enough to optimal (e.g. with a rate that is typically less than 5% above the entropy), so G/R codes are quite popular. The optimal codes for TSG sources involve a set of four code variants, which are more complex to implement and improve compression by 5% or less in most cases. Therefore, in most cases G/R coders provide the best tradeoff between performance and simplicity.

In FIG. 1, the probability distribution is represented by a single parameter, which is the rate of decay of the exponential. The faster the rate of decay, then the more likely is the value of zero. This means that in many cases zero is so likely that runs of zeros become very likely. In other words, if the probability distribution rate of decay is fast enough then encoding runs is a good idea. Encoding runs of zeros means that just a few bits are used to take care of many entries in the input data.

Encoding runs of data is efficiently performed using Run-Length encoding. Run length encoding is a simple form of data compression in which sequences of the same value repeated consecutively (or "runs") are stored as a single data value and the length of the run, rather than as the original run.

Prediction errors are much more likely to be zero if the data matches the model used by the predictor in predictive coding, for example. It is possible, however, even with a good model, to every once in a while have a large value. This can occur when a boundary is reached, such as a pixel value goes from a background value to a foreground value. Every now and then big numbers can occur. When this happens, one type of encoding technique that is more useful than Run-Length encoding is known as a "Run-Length Golomb/ Rice (RLGR)" encoding technique. One such RLFT encoding technique is disclosed in U.S. Pat. No. 6,771,828 to Malvar entitled "System and Method for Progressively Transform Coding Digital Data" and U.S. Pat. No. 6,477, 280 to Malvar entitled "Lossless Adaptive Encoding of Finite Alphabet Data".

In reality, with the source of data varying, the probabilities will not stay constant and will vary over time. This is true with, for example, images and audio. Typically, these probability variations in the input data are handled in a variety of different ways. In JPEG, for example there is an entropy coder (a Huffman coder) whereby codewords of different lengths are used for different values to be encoded. The Huffman table is usually pre-designed, that is, typically a number of images are obtained, their probabilities are measured, and an average model is constructed that is used for all images. One problem with this approach is that with every portion of an image there is a loss in encoding efficiency, because the probability model being used by the entropy coder is good on average but not necessarily good for that portion of the image.

From Table 1 it can be seen that there are two main issues with Golomb/Rice codes: (1) the probability decay parameter θ, or equivalent the probability P(x=0) must be known, so the appropriate value of k can be determined; and (2) if the decay parameter is too small, the entropy H(x) is less than 1, and thus the Golomb/Rice code is suboptimal, since its average codeword length cannot be less than 1 bit/ symbol.

In practice, the first issue (estimation of the optimal Golomb/Rice parameter) is usually addressed by dividing the input vector into blocks of a predetermined length. For each block, the encoder makes two passes over the data. In the first pass, the average magnitude of input values is computed. For that, the parameter 0 can be estimated from Equation 2, and the corresponding optimal k can be determined. In a second pass, the encoder generates the bitstream for the block by first outputting the value of k in binary form, followed by the concatenated strings of Golomb/Rice codes for the data values within the block. This is the approach used in essentially all lossless compression systems that use Golomb/Rice codes, such as JPEG-LS for lossless image compression, SHORTEN for lossless audio compression, and others. This is called a "blockwise adaptation" or "forward adaptation" model. The forward adaptation model is forward in the sense that the encoder looks at the data first before encoding, measures a statistical parameter (usually the average magnitude), and then encodes based on that parameter and puts the value of the parameter used to encode the data in a header, for use by the decoder. Instead of trying to code the data all at once, the data is broken up into small portions, or blocks. For each block, the statistics of that block are measured, a statistical parameter is measure for that portion of data that matches what is in the buffer, and the entropy coder is adjusted to that parameter. In the encoded file a header is inserted that indicates the value of the parameter being used to encode that block of data.

The second issue in practice, namely, encoding sources with very low entropy, is usually addressed using a blockwise adaptation or forward adaptation model, and if the average magnitude value of the input symbols in the block is small enough that the estimated entropy H(x) is less than 1, then the encoder uses Run-Length coding, instead of Golomb/Rice coding.

Although these approaches work well in practice, they have two main disadvantages. One disadvantage is that the encoder needs to read each input block twice, such that two passes are performed on the data: a first time to compute the average magnitude to determine the Golomb/Rice parameter, and a second time to perform the actual encoding. This requires the encoder to perform additional work and adds complexity. In some applications encoding time is not an issue, but for digital cameras, for example, it can slow down the encoding process or increase the cost of random-access memory. In particular, the forward adaptation model must first look at the data and measure the statistics, find model parameters, and then encode. This is not an issue if the encoder runs on a personal computer having a great deal of processing power. However, if pictures taken with a cell phone, they are being encoded by the cell phone itself, where processing power is much more limited.

The second and most important disadvantage involves the difficulty in choosing the block size. If the block size is too large, the statistics could change dramatically within the block. On the other hand, if the block size is too small, then the overhead of having to tell the decoder which parameter was used to encode that block of data becomes burdensome. For every block, the encoder must store what parameters values are being used to encode that block. At some point the overhead required to encode the small block is not worth the compression achieved. This is creates a trade-off. On the one hand, if a small block is used, the statistics of the block can be matched, however, measuring the statistics is difficult because there are few numbers, and the overhead of encoding is great. On the other hand, if a large block is used, the problem is that the statistics can vary greatly within the block. In practice, it is hard to find a compromise between those two conflicting factors, so that the block size is usually chosen to be between 128 and 2,048 samples, depending on the type of data to be encoded.

One solution is to use a backward-adaptive technique in the encoder. With backward adaptation, encoding starts with the decoder and encoder agreeing on initial states is for each block. In other words, each parameter is initialized to a predetermined value, and then the encoding begins. Every time the encoder produces an output symbol, that symbol can be sent to the decoder immediately, because the decoder knows the parameter values used to encode it. After the encoder outputs a symbol, it then computes new values for the encoding parameters, depending on the symbol that was output, according to a predetermined adaptation rule. The decoder knows the parameter adaptation rule, and therefore it can also compute the new values for the encoding parameters. Thus, the encoding parameters are adjusted after every encoded symbol, and the encoder and decoder are always in sync, that is, the decoder tracks the changes in the encoding parameters. This means that the encoder does not need to send the decoder any overhead information in terms of what parameter values were used to encode the data.

Therefore, what is needed is a lossless compression encoder and method provides efficient compression of integer data by switching between Run-Length encoding for encoding runs of zeros and Golomb/Rice encoding for encoding numbers after the run of zeros. In addition, what is needed is an adaptive encoder and method that is capable of handling and encoding any input integer number that may appear after the run of zeros. Moreover, what is also needed is an adaptive encoder and method that avoids the aforementioned problems with forward adaptation by using a backward-adaptive technique to provide fast tracking and efficient compression of the input data.

SUMMARY OF THE INVENTION

The invention disclosed herein includes an adaptive Run-Length Golomb/Rice (RLGR) encoder and decoder (codec) and method for lossless encoding of integer data. The adaptive RLGR codec and method uses backward adaptation to provide fast tracking of changing statistics in the input data. Using backward adaptation, the adaptive RLGR codec and method quickly learns any changes in the statistics of the input data. In addition, the adaptive RLGR codec and method is capable of encoding any input integer value. The adaptive RLGR codec and method may be applied in a wide variety of compression applications, including multimedia compression systems such as audio, image and video encoders.

The adaptive RLGR codec and method combines Run-Length encoding and Golomb/Rice (G/R) encoding in a novel way. In particular, the adaptive RLGR codec and method has a first mode, which is G/R encoding only (G/R only mode), and a second mode, which is G/R encoding plus Run-Length encoding (RLGR mode). The adaptive RLGR codec and method also uses a novel backward-adaptive technique that adjusts the encoding parameters after each encoded symbol. The encoding mode (G/R only mode or RLGR mode) is automatically determined from the parameter values. No probability tables or codeword tables are necessary, so the adaptive RLGR codec and method can fit within a small memory footprint. The adaptive RLGR codec and method thus is well-suited for modern processors, where memory access usually takes many more cycles than instruction fetching and execution. It is also well-suited for small devices with limited memory and limited processing power, because the adaptive RLGR codec and method does not need to buffer the input data in blocks, and does not need to process each data value twice.

The adaptive RLGR codec and method uses simple but novel combination of coding rules, mapping strings of the input data to output codewords, depending on the encoding mode. The adaptive RLGR codec and method also uses a novel backward-adaptive technique having novel adaptation rules. Two parameters are used, namely, an encoder run parameter (s) and a Golomb/Rice (G/R) parameter (k). The encoding run parameter controls whether the adaptive RLGR codec and method uses Run-Length encoding (for s>0) and, if so, then how Run-Length encoding is used. The G/R parameter is used in both encoding modes to either encode directly the input value (in the G/R only mode, s=0) or to encode the input value after an incomplete run of zeros (in the RLGR mode).

One of the main advantages of the adaptive RLGR codec and method is that its parameters (s and k) are adjusted and updated after every codeword that is generated. This allows any changes in the statistics of the input data be tracked very quickly. No overhead is necessary to transmit the encoding parameters to the decoder, because their changes are tracked by the decoder. Because the adaptation rules are simple, the computational complexity of using backward adaptation is low. Thus, the adaptive RLGR codec and method is attractive for many practical applications.

The adaptive RLGR method includes selecting between a first encoding mode that uses an entropy encoder other than a Run-Length encoder and a second encoding mode that uses the entropy encoder combined with the Run-Length encoder, and adapting the encoders of the first and second modes using a backward-adaptive technique. Typically, the entropy encoder is a Golomb/Rice encoder. The backward-adaptive technique includes using an encoding mode parameter, s, to select between the first and second modes, and a Golomb/Rice (G/R) parameter, k, for use with the G/R encoder. If s=0, then the first encoding mode is selected, and if s>0, then the second encoding mode is selected. Each of these parameters is updated after every codeword that is generated by the Run-Length encoder or the G/R encoder.

The encoding rule depends on the encoding mode. If s=0, then the next input value x is encoded by first mapping it to a nonnegative value u via a simple 1—1-mapping rule (u=2x if x>0, and u=−2x−1, if x<0), and then encoding u using a Golomb/Rice encoder with parameter k, so the output codeword is denoted as GR(u,k). If s>0, then a run r of zeros of input values x is first examined. If $r=2^s$, then the run r is defined as a complete run and the output codeword is a single bit equal 0. If $r<2^s$, then the run r is define as an incomplete run and the codeword is 1+bin(r,s)+GR(u,k), where bin(r,s) is the binary representation of the length of the incomplete run r in s bits, and GR(u,k) is the Golomb/Rice code for the value following the incomplete run r (using again the mapping from x to u).

After a symbol is encoded, then a parameter adaptation rules are applied. The adaptation rules of the backward-adaptive technique include rules for each of the parameters s and k. The adaptation rule for s is follows. If s=0 (G/R only mode), then the absolute value of the input value x is examined. If |x|=0, then a scaled version of s, namely S, is increased by a first integer constant, A1. If |x|>0, then S is decreased by a second integer constant, B1. If s>0 (RLGR mode), then if the run r is a complete run, then S is increased by a third integer constant, A2. If the run r is an incomplete run, then s is decreased by a fourth integer constant, B2. The value of s to be used for generating the next codeword is then computed as s=S/L, where L is a fixed parameter (the division by L is just a shift operator if L is chosen as a power of two).

The adaptation rule for k is as follows. From the input value u (recall that the GR coder always operates on u values), a temporary value p is computed by p=u>>k (where >>denotes a right-shift operator). If p=0, then a scaled version of k, namely K, is decreased by a fifth integer constant, B3. If p=1, then k is left unchanged. If p>1, then K is increased by p. In this manner, the parameter k is updated for the G/R encoder in both the first and second modes, after each codeword is generated. The value of k to be used for generating the next codeword is then computed as k=K/L, where L is a fixed parameter (recall that division by L is just a shift operator if L is chosen as a power of two).

It can be seen from the descriptions of the adaptation rules above that the adaptive RLGR method also includes a feature called "fractional adaptation". Fractional adaptation allows for a finer control of the rate of adaptation. First, a scaling parameter, L, is defined, and the value of L is typically set to a power of two. Next, a scaled encoding mode parameter, S=s*L and a scaled G/R parameter, K=k*L, are defined. When using the above adaptation rules for s and k, the scaled parameter values S and K are incremented or decremented by integer constants, depending on the generated codeword. After adaptation of S and K, the final parameter values and k are computed by s=S/L and k=K/L. That way, the integer increments for S and K can be seen as fractional increments for s and k, which allow smoother control of the values of s and k, thus with better tracking of changes in the input statistics. If s and k were adjusted by integer increments after every encoded symbol, their values would fluctuate too much. Such noise in parameter values would lead to a decrease in the compression ratio (the ratio in the number of bits needed to store the input data in straight binary format to the number of bits needed to store the encoded bitstream).

An adaptive RLGR codec includes modules for incorporating the adaptive RLGR method described above.

An adaptive RLGR codec and method works by using decoding rules corresponding to the encoding rules above, and using the same parameter adaptation rules described above. The decoding rule at the decoder reverses the previously described encoding rule at the encoder. Namely, if s=0, then the decoder reads as many bits from the input bitstream (or file) as necessary, depending on the current value of the GR parameter k. In this manner, the decoder reads a complete codeword corresponding to a valid Golomb/Rice code GR(u,k), according to Table 1. Since the Golomb/Rice code is uniquely decodable for every parameter k, the decoder then can decode that codeword. In other words, the decoder can determine the value of the symbol u that was present at the encoder. From u, the decoder can determine the corresponding data value x simply by using the inverse 1—1 mapping rule. In particular, if u is even, then x=u/2, and, if u is odd, then x=−(u+1)/2. If s>0, then the decoder reads the next bit from the input bitstream or file. If that bit equals 0 (zero), then the decoder produces an output which is a string of r zeros, with $r= 2^s$. If that bit equals 1 (one), then the decoder reads the next s bits as a binary representation of the variable r. The decoder then reads as many bits from the input bitstream (or file) as necessary, depending on the current value of the GR parameter k. In this manner, a complete codeword is read corresponding to a valid Golomb/Rice code GR(u,k). From the G/R code the decoder can determine the temporary variable u and can compute the input data value x that followed the partial string of zeros via the inverse 1—1 mapping rule. Specifically, if u is even, then x=u/2, and if u is odd, then x=−(u+1)/2. The decoder then outputs the string of r zeros followed by that value x. The decoding process described above is performed to decode an input codeword into an output value or string of values that matches exactly what was seen at the encoder. Thus, the decoding process is lossless.

After decoding a codeword from the input bitstream or file as described above, the decoder then computes the same adaptation rules as described for the encoder above. In this manner, the decoder will adjust the values of the parameters s and k in exactly the same way as the encoder does. Thus, the parameters will have the correct value for decoding the next bitstream (or file) codeword.

BRIEF DESCRIPTION OF THE DRAWINGS

The present invention can be further understood by reference to the following description and attached drawings that illustrate aspects of the invention. Other features and advantages will be apparent from the following detailed description of the invention, taken in conjunction with the accompanying drawings, which illustrate, by way of example, the principles of the present invention.

Referring now to the drawings in which like reference numbers represent corresponding parts throughout.

DETAILED DESCRIPTION OF THE INVENTION

Figure 1:
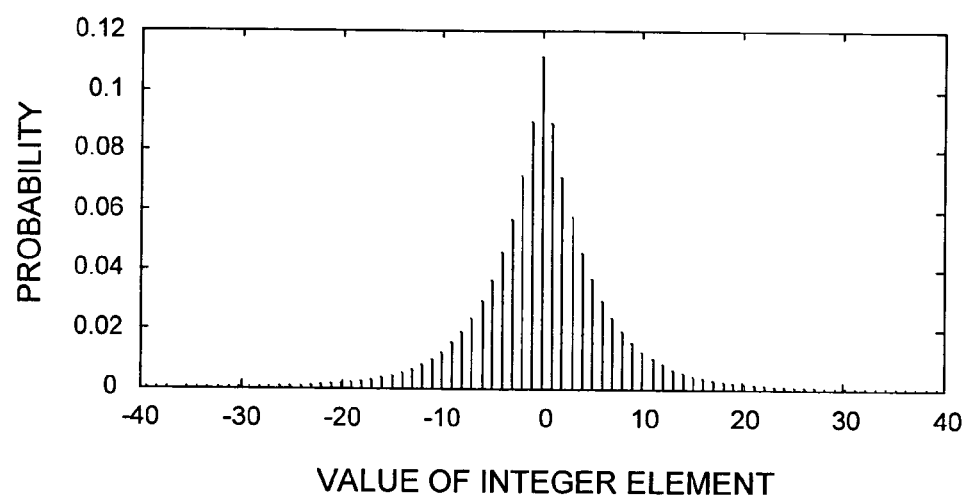
FIG. 1 illustrates a typical probability distribution for integer values that works well with the adaptive Run-Length Golomb/Rice (RLGR) encoder and method disclosed herein.

In the following description of the invention, reference is made to the accompanying drawings, which form a part thereof, and in which is shown by way of illustration a specific example whereby the invention may be practiced. It is to be understood that other embodiments may be utilized and structural changes may be made without departing from the scope of the present invention.

I. Introduction

The Run-Length Golomb/Rice (RLGR) encoder and method disclosed herein can be used in a wide variety of compression applications. Multimedia compression systems (e.g. audio, image, and video codecs), as well as other systems that use a prediction or transform approach to compression, usually generate integer data with probability distributions similar to that of FIG. 1. The RLGR codec and method has been implemented in applications for compression of image, audio, terrain elevation, and geometric map data. The results of using the RLGR codec and method in these applications have been compression ratios that are comparable to the most sophisticated entropy coders, but in a simpler implementation.

The RLGR codec and method disclosed herein is an improved technique for the lossless compression of integer data. Vectors containing integer values are mapped by the encoder into a bitstream, which later then can be reconstructed exactly by the decoder. Using backward-adaptation for improved performance, the RLGR codec and method quickly learns and adapts to changes in the statistics of the input data. The RLGR codec and method may be applied in a wide variety of compression applications including multimedia compression systems such as audio, image, and video codecs, The RLGR codec and method combines Run-Length encoding and Golomb-Rice encoding in a novel way, and is characterized by a backward-adaptation strategy that adjusts the encoder parameters after each encoded symbol. Probability tables or codeword tables are unnecessary, which allows the RLGR codec and method to fit in a very small memory footprint. The RLGR codec and method thus is particularly well-suited for modern processors, where memory access takes usually many more cycles than instruction fetching and execution.

One key advantage of the RLGR codec and method over previous kinds of entropy coders is that its backward-adaptation strategy quickly learns changes in the statistics of the data. Thus, in practice the RLGR codec and method has exhibited better performance than other kinds of encoders, such as Huffman coders, block-adaptive Golomb/Rice encoders or context-adaptive arithmetic encoders. Another advantage of using a backward-adaptation strategy for the encoding parameters is that probability estimators are not needed. Still another advantage of the RLGR codec and method is that it performs adaptation after each encoded symbol, in a single pass over the data, thus producing better compression results and faster encoding than encoders that use blockwise or forward adaptation.

II. General Overview

Figure 2A:
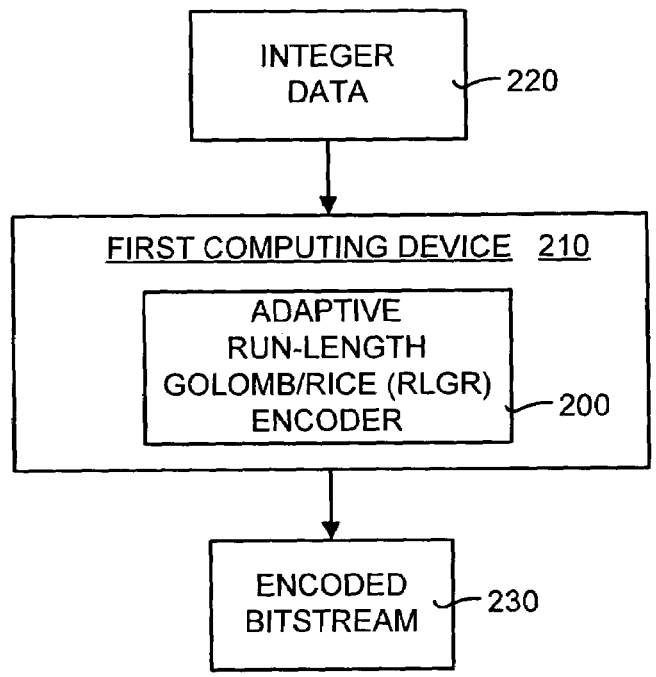
FIG. 2A is a block diagram illustrating an exemplary implementation of an encoder portion of the RLGR codec and method disclosed herein.
Figure 2B:
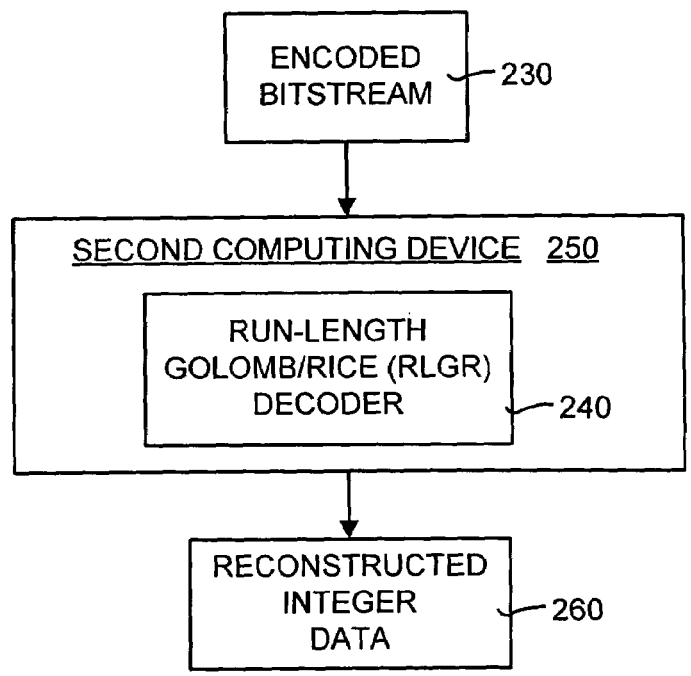
FIG. 2B is a block diagram illustrating an exemplary implementation of a decoder portion of the RLGR codec and method disclosed herein.

FIGS. 2A & B are block diagrams illustrating an exemplary implementation of an adaptive Run-Length Golomb/Rice (RLGR) encoder and method disclosed herein. In FIG. 2A, a block diagram for an encoder portion of the adaptive Run-Length RLGR codec and method is shown. In FIG. 2B, a block diagram for the decoder portion of the adaptive Run-Length RLGR codec and method is shown. It should be noted that FIGS. 2A & B are merely two of several ways in which the adaptive RLGR codec and method may implemented and used.

Referring to FIG. 2A, the adaptive RLGR encoder 200 runs on a first computing device 210. The adaptive RLGR encoder 200 inputs and processes integer data 220. In general, given the integer data 220, such as a vector containing integer values, the adaptive RLGR encoder 200 encodes or maps the integer data 220 into an encoded bitstream 230. The integer data 220 typically contains vectors of integers such that the most probable value is zero and any nonzero values have probabilities that decrease as the values increase. This type of integer data typically has a probability distribution function (PDF) similar to that shown in FIG. 1. After the integer data is encoded, the encoded bitstream 230 may be stored or transmitted.

Referring to FIG. 2B, a RLGR decoder 240 resides on a second computing device 250. It should be noted that although shown as separate computing devices, the first computing device 210 and the second computing device 250 may be the same computing device. In other words, the RLGR encoder 200 and decoder 240 may reside on the same computing device. In general, the RLGR decoder 240 processes the encoder bitstream 230 and outputs a reconstructed integer data 260. Because the adaptive RLGR encoder 200 performs lossless encoding of the integer data 220, the RLGR decoder 240 can read the encoded bitstream 230 and reconstruct exactly the original data vector contained in the integer data 220.

It should be noted that in practical applications a device or equipment may incorporate an RLGR encoder but not an RLGR decoder (for example, a digital camera). Similarly, a device or equipment may incorporate an RLGR decoder but not an RLGR encoder (for example, a digital audio player or a digital picture viewer).

III. Exemplary Operating Environment

The adaptive Run-Length Golomb/Rice (RLGR) codec and method are designed to operate in a computing environment and on a computing device, such as the first computing device 210 and the second computing device 250 shown in FIG. 2. The computing environment in which the adaptive RLGR codec and method operates will now be discussed. The following discussion is intended to provide a brief, general description of a suitable computing environment in which the adaptive Run-Length Golomb/Rice (RLGR) encoder and method may be implemented.

Figure 3:
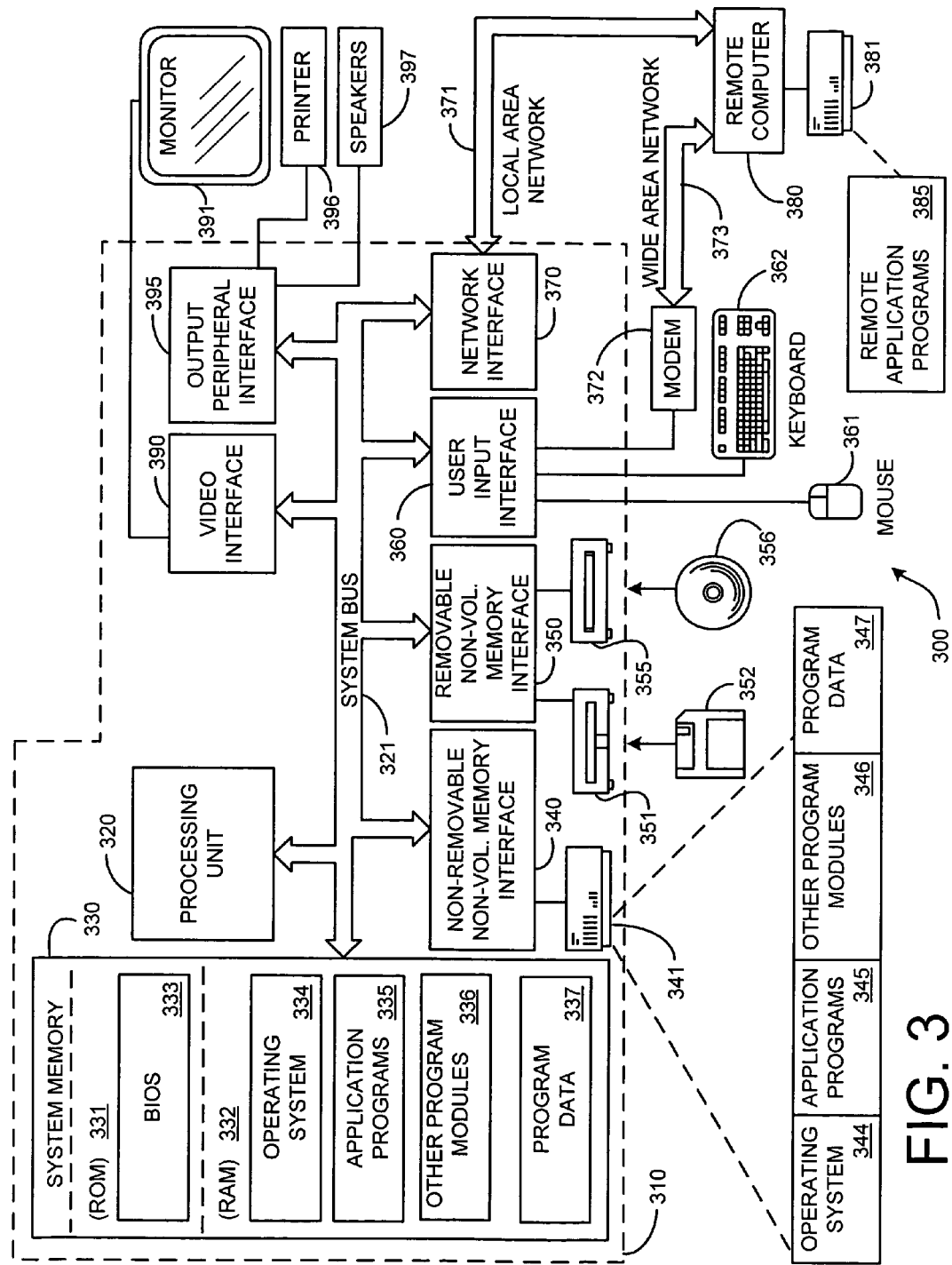
FIG. 3 illustrates an example of a suitable computing system environment in which the adaptive RLGR codec and method shown in FIG. 2 may be implemented.

FIG. 3 illustrates an example of a suitable computing system environment in which the RLGR codec and method shown in FIG. 2 may be implemented. The computing system environment 300 is only one example of a suitable computing environment and is not intended to suggest any limitation as to the scope of use or functionality of the invention. Neither should the computing environment 300 be interpreted as having any dependency or requirement relating to any one or combination of components illustrated in the exemplary operating environment 300.

The adaptive RLGR codec and method is operational with numerous other general purpose or special purpose computing system environments or configurations. Examples of well known computing systems, environments, and/or configurations that may be suitable for use with the adaptive RLGR codec and method include, but are not limited to, personal computers, server computers, hand-held, laptop or mobile computer or communications devices such as cell phones and PDA's, multiprocessor systems, microprocessor-based systems, set top boxes, programmable consumer electronics, network PCs, minicomputers, mainframe computers, distributed computing environments that include any of the above systems or devices, and the like.

The adaptive RLGR codec and method may be described in the general context of computer-executable instructions, such as program modules, being executed by a computer. Generally, program modules include routines, programs, objects, components, data structures, etc., that perform particular tasks or implement particular abstract data types. The adaptive RLGR codec and method may also be practiced in distributed computing environments where tasks are performed by remote processing devices that are linked through a communications network. In a distributed computing environment, program modules may be located in both local and remote computer storage media including memory storage devices. With reference to FIG. 3, an exemplary system for implementing the adaptive RLGR codec and method includes a general-purpose computing device in the form of a computer 310. The computer 310 is an example of the first computing device 210 and the second computing device 250 shown in FIG. 2.

Components of the computer 310 may include, but are not limited to, a processing unit 320, a system memory 330, and a system bus 321 that couples various system components including the system memory to the processing unit 320. The system bus 321 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 310 typically includes a variety of computer readable media. Computer readable media can be any available media that can be accessed by the computer 310 and includes both volatile and nonvolatile media, removable and non-removable media. By way of example, and not limitation, computer readable media may comprise computer storage media and communication media. Computer storage media includes volatile and nonvolatile removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computer 310. Communication media typically embodies computer readable instructions, data structures, program modules or other data in a modulated data signal such as a carrier wave or other transport mechanism and includes any information delivery media.

Note that the term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 330 includes computer storage media in the form of volatile and/or nonvolatile memory such as read only memory (ROM) 331 and random access memory (RAM) 332. A basic input/output system 333 (BIOS), containing the basic routines that help to transfer information between elements within the computer 310, such as during start-up, is typically stored in ROM 331. RAM 332 typically contains data and/or program modules that are immediately accessible to and/or presently being operated on by processing unit 320. By way of example, and not limitation, FIG. 3 illustrates operating system 334, application programs 335, other program modules 336, and program data 337.

The computer 310 may also include other removable/non-removable, volatile/nonvolatile computer storage media. By way of example only, FIG. 3 illustrates a hard disk drive 341 that reads from or writes to non-removable, nonvolatile magnetic media, a magnetic disk drive 351 that reads from or writes to a removable, nonvolatile magnetic disk 352, and an optical disk drive 355 that reads from or writes to a removable, nonvolatile optical disk 356 such as a CD ROM or other optical media.

Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 341 is typically connected to the system bus 321 through a non-removable memory interface such as interface 340, and magnetic disk drive 351 and optical disk drive 355 are typically connected to the system bus 321 by a removable memory interface, such as interface 350.

The drives and their associated computer storage media discussed above and illustrated in FIG. 3, provide storage of computer readable instructions, data structures, program modules and other data for the computer 310. In FIG. 3, for example, hard disk drive 341 is illustrated as storing operating system 344, application programs 345, other program modules 346, and program data 347. Note that these components can either be the same as or different from operating system 334, application programs 335, other program modules 336, and program data 337. Operating system 344, application programs 345, other program modules 346, and program data 347 are given different numbers here to illustrate that, at a minimum, they are different copies. A user may enter commands and information into the computer 310 through input devices such as a keyboard 362 and pointing device 361, commonly referred to as a mouse, trackball or touch pad.

Other input devices (not shown) may include a microphone, joystick, game pad, satellite dish, scanner, radio receiver, or a television or broadcast video receiver, or the like. These and other input devices are often connected to the processing unit 320 through a user input interface 360 that is coupled to the system bus 321, but may be connected by other interface and bus structures, such as, for example, a parallel port, game port or a universal serial bus (USB). A monitor 391 or other type of display device is also connected to the system bus 321 via an interface, such as a video interface 390. In addition to the monitor, computers may also include other peripheral output devices such as speakers 397 and printer 396, which may be connected through an output peripheral interface 395.

The computer 310 may operate in a networked environment using logical connections to one or more remote computers, such as a remote computer 380. The remote computer 380 may be a personal computer, a server, a router, a network PC, a peer device or other common network node, and typically includes many or all of the elements described above relative to the computer 310, although only a memory storage device 381 has been illustrated in FIG. 3. The logical connections depicted in FIG. 3 include a local area network (LAN) 371 and a wide area network (WAN) 373, but may also include other networks. Such networking environments are commonplace in offices, enterprise-wide computer networks, intranets and the Internet.

When used in a LAN networking environment, the computer 310 is connected to the LAN 371 through a network interface or adapter 370. When used in a WAN networking environment, the computer 310 typically includes a modem 372 or other means for establishing communications over the WAN 373, such as the Internet. The modem 372, which may be internal or external, may be connected to the system bus 321 via the user input interface 360, or other appropriate mechanism. In a networked environment, program modules depicted relative to the computer 310, or portions thereof, may be stored in the remote memory storage device. By way of example, and not limitation, FIG. 3 illustrates remote application programs 385 as residing on memory device 381. It will be appreciated that the network connections shown are exemplary and other means of establishing a communications link between the computers may be used.

IV. System Components

Figure 4:
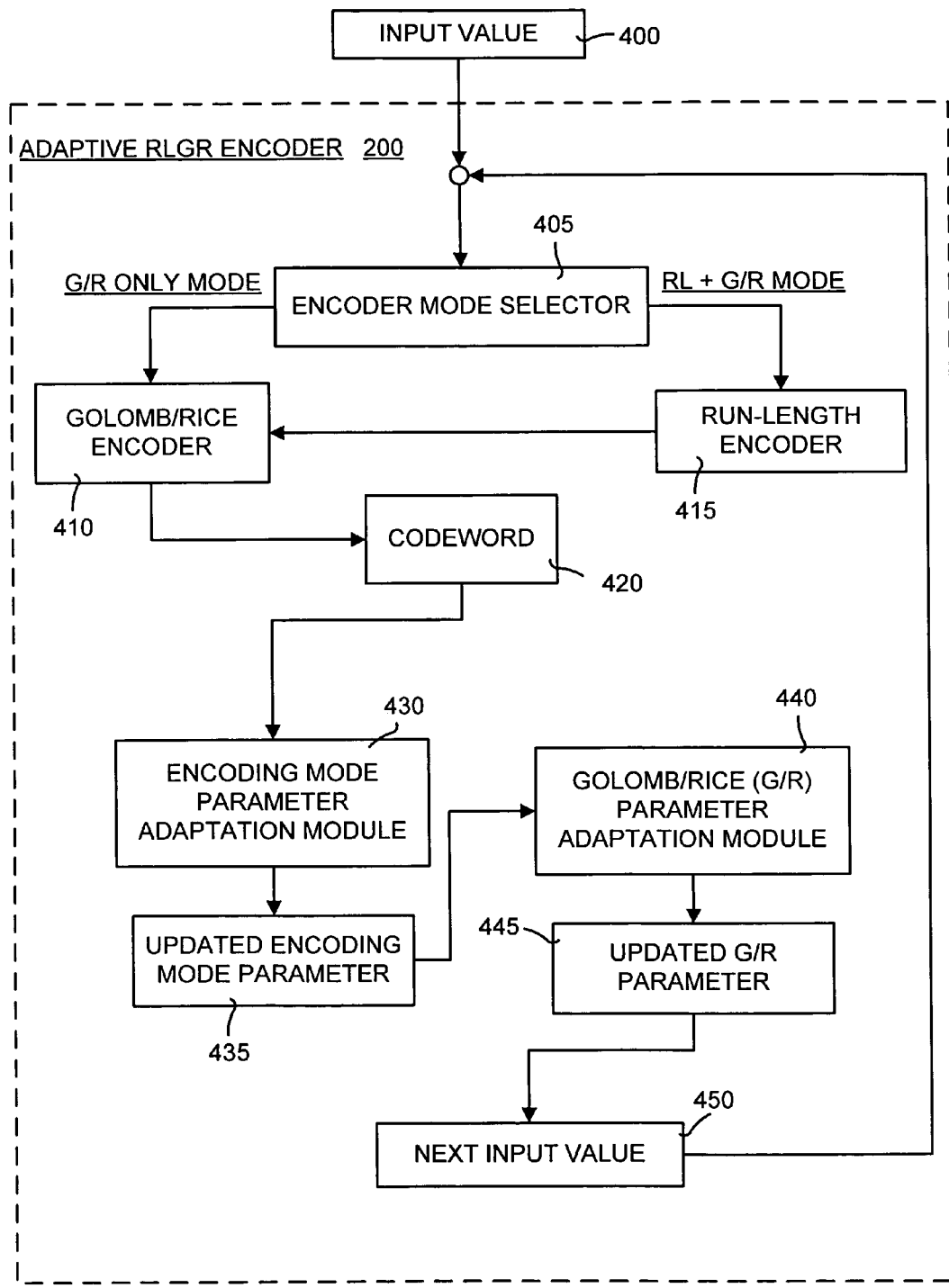
FIG. 4 is a general block diagram illustrating components of the adaptive RLGR encoder shown in FIG. 2.

FIG. 4 is a general block diagram illustrating components of the adaptive RLGR encoder 200 shown in FIG. 2. The adaptive RLGR encoder receives as input an input value (or string of values) 400. An encoder mode selector 405 then is used to select and switch between one of the two modes of the adaptive RLGR encoder 200. In particular, as shown in FIG. 4, the encoder mode selector 405 can select either a Golomb/Rice only mode or a Run-Length and Golomb/Rice encoder mode. The Golomb/Rice only mode uses only a Golomb/Rice encoder 410 having adaptive parameters. The Run-Length and Golomb/Rice encoder mode uses both a Run-Length encoder 415 having adaptive parameters and the adaptive Golomb/Rice encoder 410.

One of the above two modes is used to encode the input value (or string) 400 to obtain a codeword 420. After the encoding of each input value (or string) 400, the encoding parameters are adapted to track the statistics of the input data. The adaptive RLGR encoder 200 uses at least two types of parameters. First, an encoding mode parameter is used to control whether the encoding mode uses the Run-Length encoder and, if so, how the Run-Length encoder is used. Second, a Golomb/Rice (G/R) parameter is used in both modes to: (a) encode every input value (if the encoder is in the G/R only mode; and (b) encode the number following an incomplete run of 0's (if the encoder is in the RLGR mode). These parameters and the adaptation of these parameters will be discussed in detail below.

An encoding mode parameter adaptation module 430 is used to update the encoding mode parameter using a backward-adaptive technique. The module 430 yields an update encoding mode parameter 435. Similarly, a Golomb/Rice parameter adaptation module 440 is used to update the original G/R parameter using a backward-adaptive technique. This yields an updated G/R parameter 445. The adaptation of both the encoding mode parameter and the G/R parameter will be discussed in detail below. Once the parameters have been updated, a next input value 450 is processed by the adaptive RLGR encoder 200 using the updated encoding mode parameter 435 and the updated G/R parameter 445.

V. Operational Overview

Figure 5:
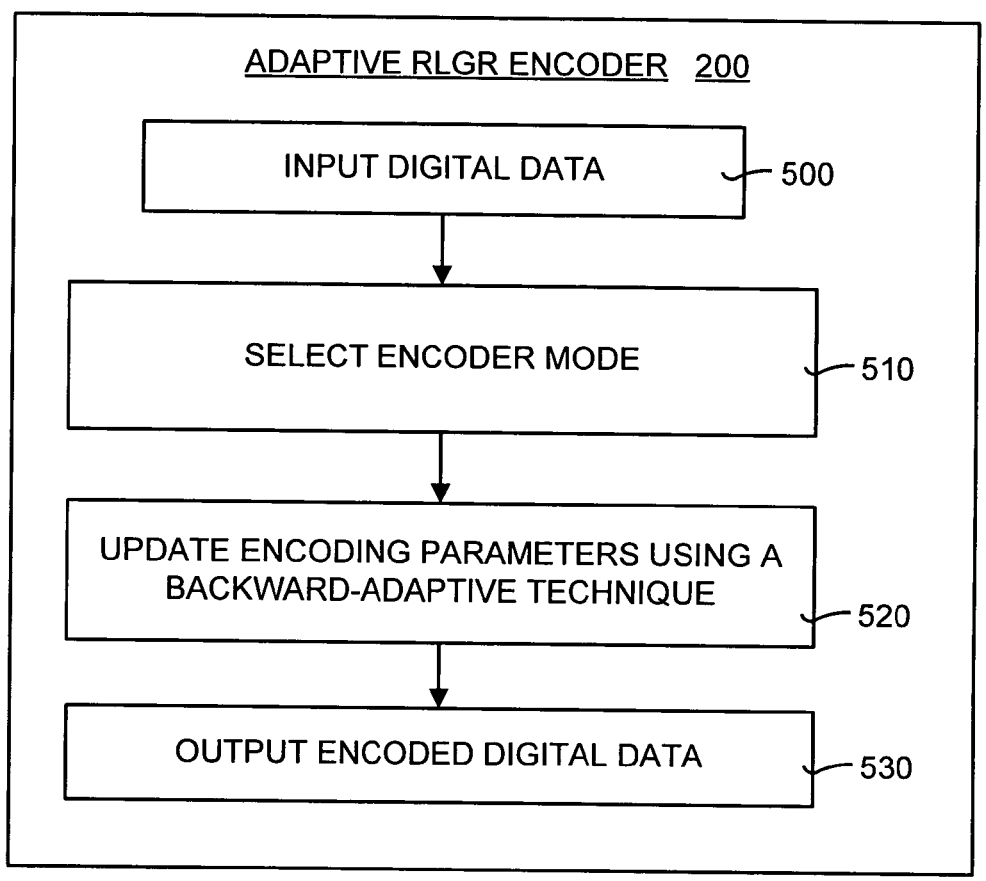
FIG. 5 is a general flow diagram illustrating the general operation of the adaptive RLGR encoder and method shown in FIGS. 2 and 4.

The operation of the adaptive RLGR encoder 200 and method used therein as shown in FIGS. 2 and 4 now will be discussed. FIG. 5 is a general flow diagram illustrating the general operation of the adaptive RLGR encoder 200 and method. The method begins by inputting digital data to be encoded (box 500). In one tested embodiment, the input digital data is integer data in the form of a vector having elements that are integer values. It should be noted that the each input digital data value can be any integer value, not restricted to a particular range (e.g. binary or binary-plus-sign, as it is common in other entropy coders). Next, the encoder mode of the adaptive RLGR encoder is selected (box 510). The mode can either be the G/R only mode or the RL+G/R mode, depending on the value of the encoding mode parameter. The selected encoder then encodes the input digital data.

The digital data is encoded in the selected mode using encoding parameters that are initialized to certain values. However, because the statistics of the input digital data may vary, the RLGR encoder 200 is adaptive. This adaptation allows the RLGR encoder 200 to track the statistics of the input digital data and adapt to those statistics quickly, to provide greater encoding efficiency. The RLGR encoder 200 and method update the encoding parameters using a backward-adaptive technique (box 520). This updating of the encoding parameters occurs after each value or string of values of the input digital data is encoded. Moreover, the backward-adaptive technique includes novel adaptation rules, which are discussed in detail below. The encoded digital data then is output (box 530). Next, the next value or string of the input digital data is processed using the method just described. The updated values of the encoding parameters are used in the encoding the next input value or string. This process is repeated until all the digital data has been encoded into an encoded bitstream.

Figure 6:
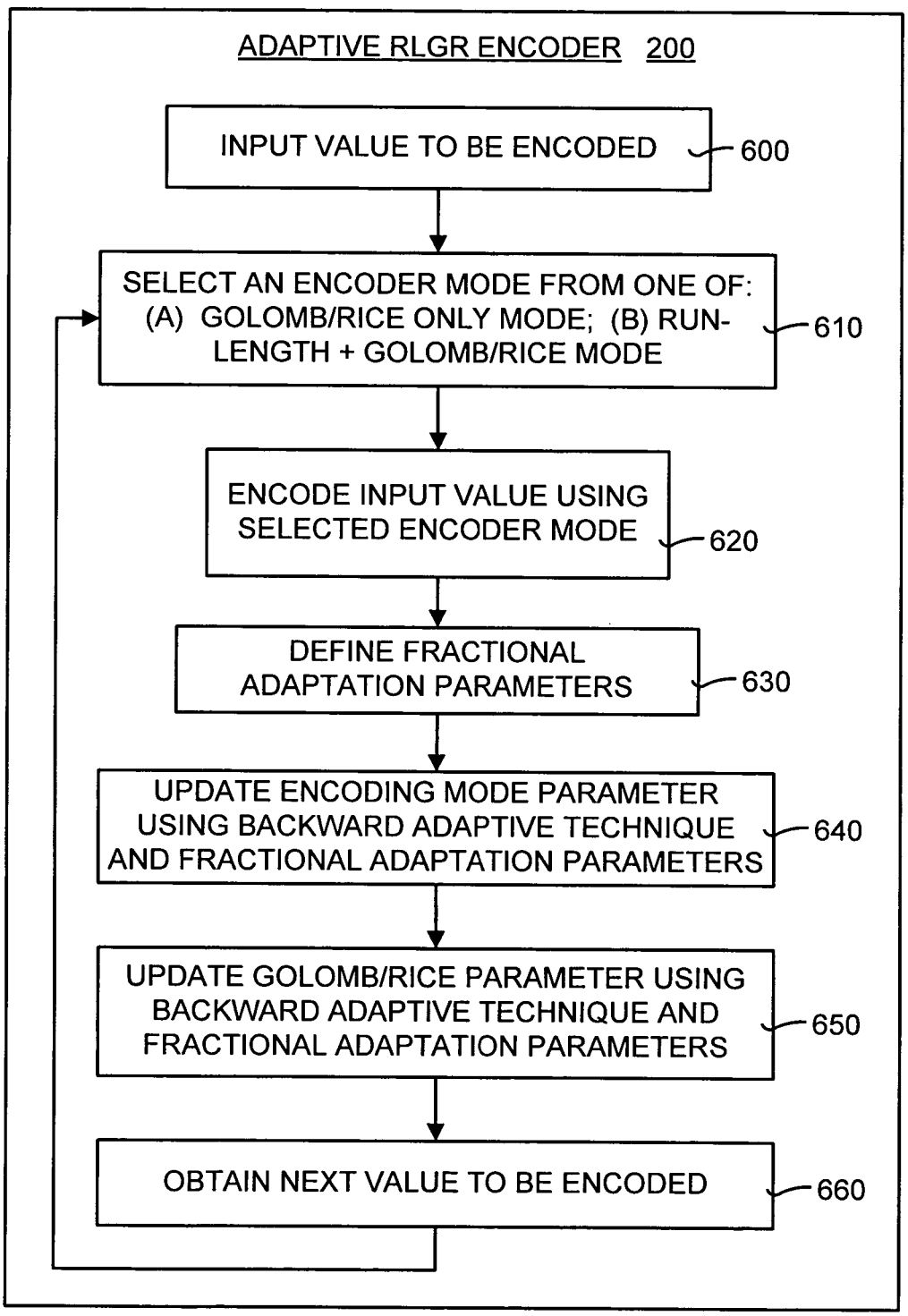
FIG. 6 is a flow diagram illustrating further details of the adaptive RLGR encoder and method shown in FIG. 5.

FIG. 6 is a flow diagram illustrating further details of the adaptive RLGR encoder and method shown in FIG. 5. Specifically, a value or string of the digital data is received as input (box 600). Next, an encoder mode is selected from one of the following modes: (a) a G/R only mode; and (b) a Run-Length and G/R mode (box 610). The input value or string then is encoded using the selected encoder mode (box 620).

After the input value or string has been encoded, the encoding parameters are updated. This adaptation process begins by defining fractional adaptation parameters (box 630). The fractional adaptation parameters are used to slow down the adaptation of the encoding parameters such that the optimal parameter values can be more closely tracked. The fractional adaptation parameters are discussed in more detail below. Next, the fractional adaptation version of the encoding mode parameter is updated using a backward-adaptive technique containing novel adaptation rules (box 640). Similarly, the G/R parameter is updated using a backward-adaptive technique and novel adaptation rules (box 650). The encoded input value or string is appended to the encoded bitstream and the next value or string from the digital data to be encoded is input (box 660). The process begins again to encode the next value or string using the updated encoding mode parameter and G/R parameter.

VI. Operational Details

The operational details of the adaptive RLGR encoder 200 and method of FIGS. 4, 5 and 6 discussed above will now be discussed.

Encoder Mode Selector

Figure 7:
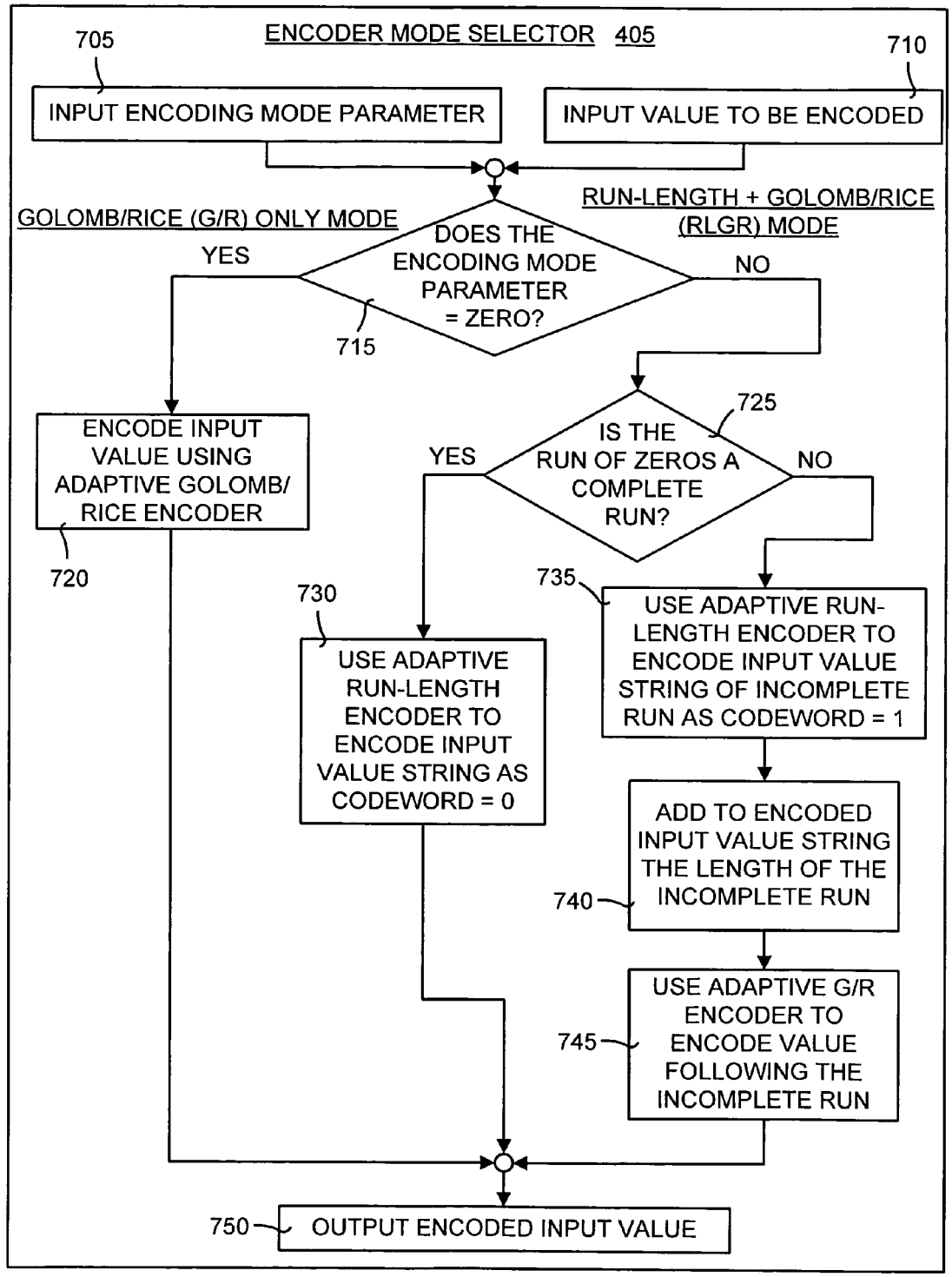
FIG. 7 is a detailed flow diagram of the operation of the encoder mode selector of the adaptive RLGR encoder and method shown in FIG. 4.

FIG. 7 is a detailed flow diagram of the operation of the encoder mode selector 405 of the adaptive RLGR encoder 200 and method shown in FIG. 4. In general, the encoder mode selector 405 selects and switches between two encoder modes based on the value of an encoding mode parameter. The selection of an encoder mode occurs after a value or string of the digital data is encoded and the encoding parameters updated.

The process begins by receiving as input an initial encoding mode parameter (box 705) and the input value (or string of zeros) to be encoded (box 710). A determination is made as to whether the value of the encoding mode parameter is equal to zero (box 715). If so, then the encoding mode is the G/R mode. Otherwise, the encoding mode is the RLGR mode.

In the G/R mode, the input value is encoded using the adaptive G/R encoder (box 720). This is a G/R encoder that uses the backward-adaptive adaptation rules for the G/R parameter. In the RLGR mode, which means that the encoding mode parameter is greater than zero, it can be expected with a high probability that the input value contains a run of zeros. A determination is made as to whether the run of zeros is a complete or an incomplete run (box 725). A run is defined as a string of the same values adjacent each other. A complete run is defined as a run having a number of zeros equal to 2 raised to the power of the encoding mode parameter. For example, if the encoding mode parameter equals 3, then $2^3=8$. Thus, in this example, a complete run is a run of 8 zeros.

If the run is a complete run, then the adaptive Run-Length encoder is used to encode the input value string as a codeword=0 (box 730). In other words, a complete run is represented by a codeword of zero. In the above example, a string of 8 zeros (which represents a complete string) would be represented by a codeword=0. If the run is an incomplete run, the input value string is encoded so as to tell the encoder that the run is incomplete, the number of zeros in the incomplete run, and the value immediately following the incomplete run. Specifically, the adaptive Run-Length encoder is used to encode the input value string as an incomplete run, represented by a codeword=1 (box 735). This alerts the decoder that the run is an incomplete run. Next, the length of the incomplete run is added to the encoded input value string (box 740). This encoded value represents the length of the incomplete run. For example, if the incomplete run is 4 zeros long, the value 4 (or "100" in binary notation) is added to the encoded bitstream to tell the decoder that the run length is equal to four.

The only piece of information left to encode is that value immediately following the incomplete run. An adaptive G/R encoder is used to encode the value immediately following the incomplete run (box 745). The G/R parameter is used when using the adaptive G/R encoder. Finally, the encoded input value (if the encoding mode is the G/R mode) or the encoded input value string (if the encoding mode is the RLGR mode) is output (box 750).

Encoding Mode Parameter Adaptation Module

Figure 8:
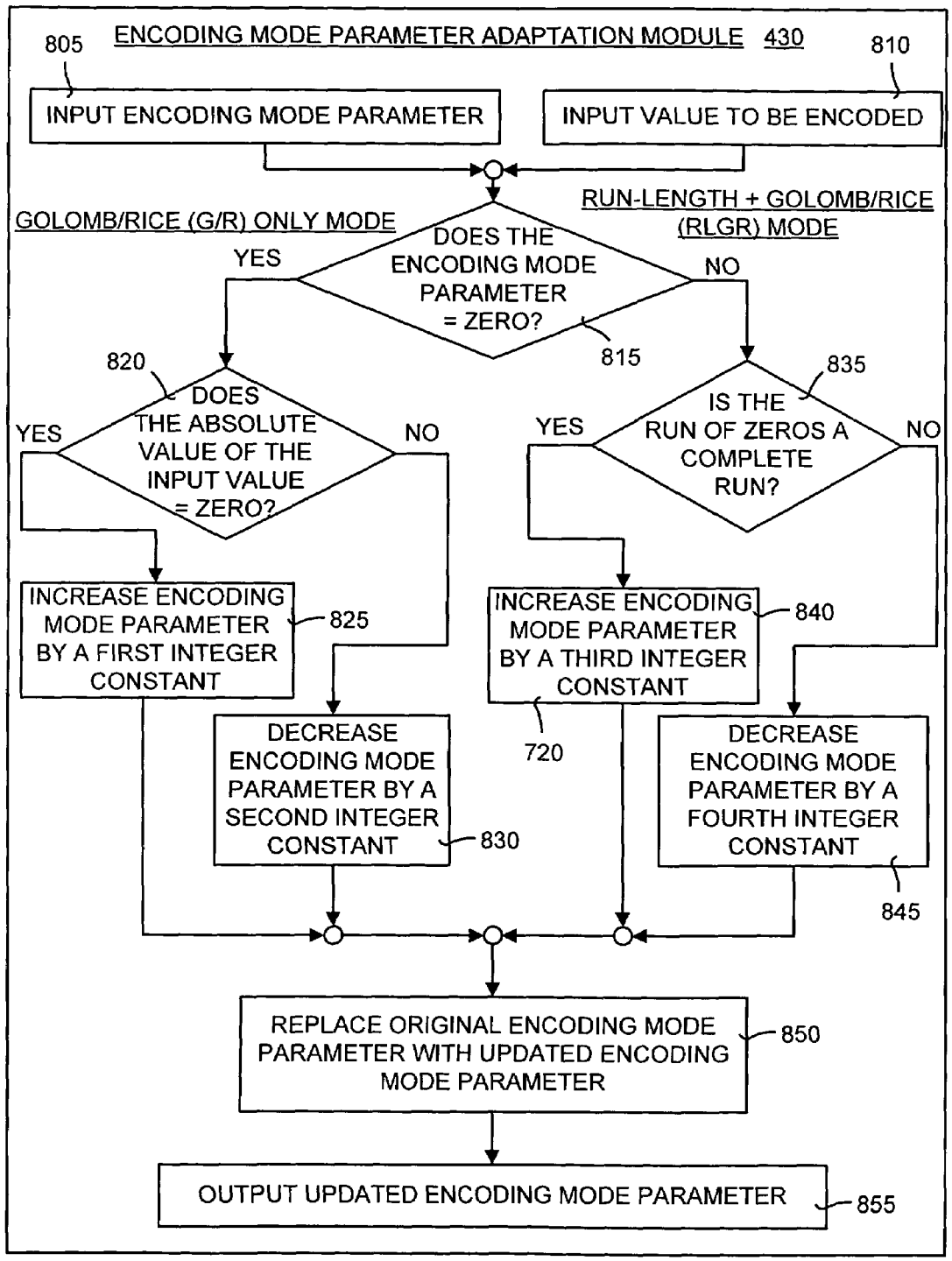
FIG. 8 is a detailed flow diagram of the operation of the encoding mode parameter adaptation module of the adaptive RLGR encoder and method shown in FIG. 4.

FIG. 8 is a detailed flow diagram of the operation of the encoding mode parameter adaptation module 430 of the adaptive RLGR encoder 200 and method shown in FIG. 4.

In general, the encoding mode parameter adaptation module 430 updates an initial encoding mode parameter using a backward-adaptive technique. The update is performed after each value or string of the digital data is encoded. The backward-adaptive technique uses novel adaptation rules to update the encoding mode parameter.

The process begins by receiving as input the initial encoding mode parameter (box 805) and the input value to be encoded (box 810). A determination then is made as to whether the encoding mode parameter is equal to zero (box 815). If so, then the encoding mode is the G/R only mode, and otherwise the encoding mode is the RLGR mode.

For the G/R only mode, a determination then is made whether the absolute value of the input value is equal to zero (box 820). If so, then the current scaled encoding mode parameter is increased by a first integer constant (box 825). If not, then the current scaled encoding mode parameter is decreased by a second integer constant (box 830).

For the RLGR mode, a determination is made whether the run of zeros in the string of the value is a complete or an incomplete run (box 835). If the run is a complete run, then the current scaled encoding mode parameter is increased by a third integer constant (box 840). If the run is an incomplete run, then the current scaled encoding mode parameter is decreased by a fourth integer constant (box 845).

Once the current scaled encoding mode parameter has been updated, the current encoding mode parameter is replaced with the updated encoding mode parameter (box 850). This is obtained by dividing the scaled encoding mode parameter by a fixed scaling factor and keeping the integer part of the result. Since the adaptation adjusts the scaled encoding mode parameter by integer steps, the actual encoding parameter behaves as if it were adapted by fractional steps. This is called "fractional adaptation", which permits finer control of the speed of adaptation. The final updated encoding mode parameter then is output (box 855). Once again, the current scaled encoding mode parameter is updated after every input value or string is encoded. The updated encoding mode parameter then is used in the encoding of the next input value or string.

Golomb/Rice (G/R) Parameter Adaptation Module

Figure 9:
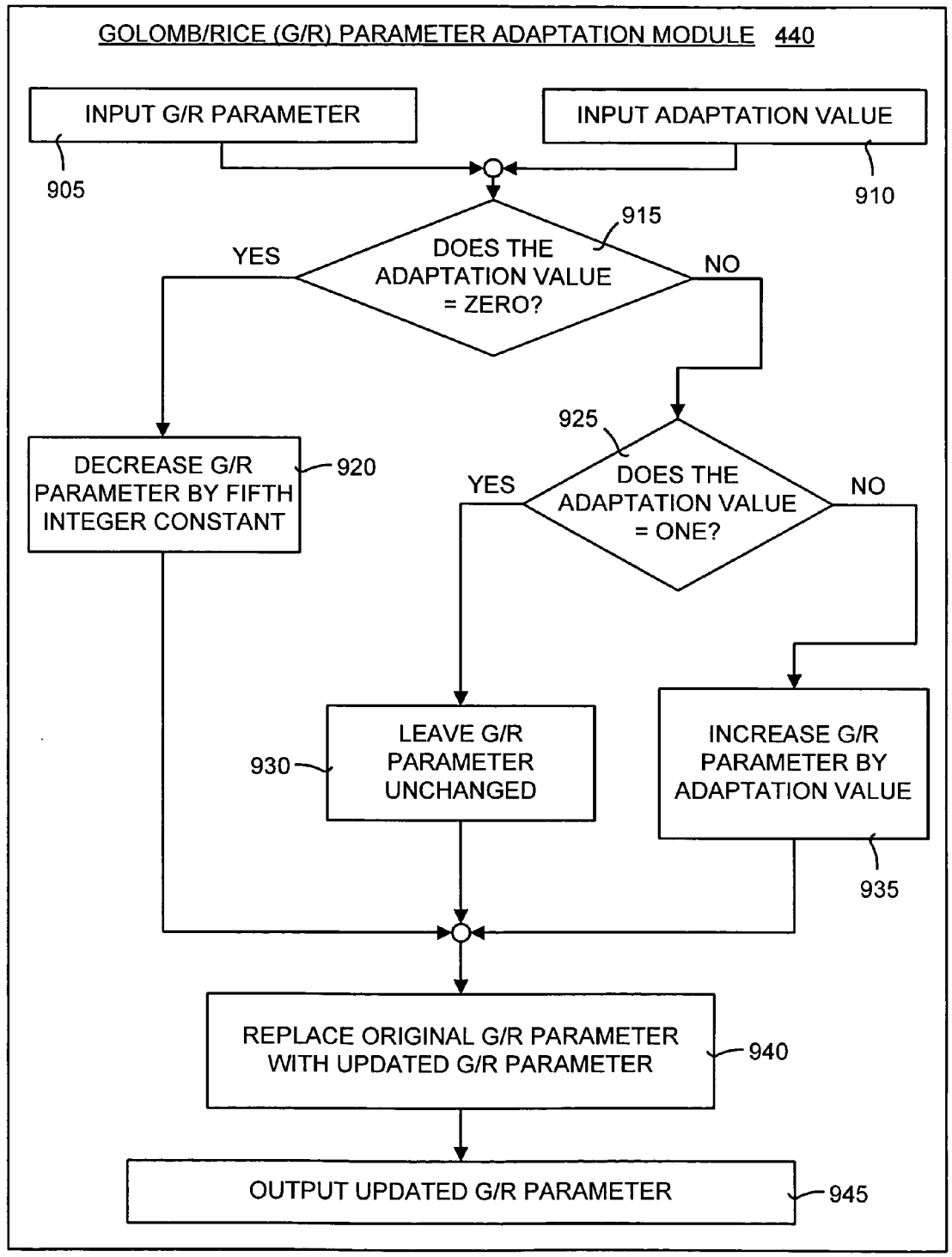
FIG. 9 is a detailed flow diagram of the operation of the Golomb/Rice (G/R) parameter adaptation module of the adaptive RLGR encoder and method shown in FIG. 4

FIG. 9 is a detailed flow diagram of the operation of the Golomb/Rice (G/R) parameter adaptation module 440 of the adaptive RLGR encoder 200 and method shown in FIG. 4. In general, the G/R parameter adaptation module 440 updates an initial G/R parameter using a backward-adaptive technique having novel adaptation rules. The update is performed after each value or string of the digital data is encoded.

The operation begins by receiving as input the initial G/R parameter (box 905) and an adaptation value (box 910), whose computation will be described later. A determination then is made as to whether the adaptation value equals zero (box 915). If so, then the adaptation rules are to decrease the scaled G/R parameter by a fifth integer constant (box 920).

If the adaptation value does not equal zero, a determination is made whether the adaptation value is equal to one (box 925). If so, then the adaptation rules leave the scaled G/R parameter unchanged (box 930). If not, then the adaptation rules are to increase the scaled G/R parameter by the adaptation value (box 935).

Once the G/R parameter has been adapted, the current G/R parameter is replaced with the updated G/R parameter (box 940). This is obtained by dividing the scaled G/R mode parameter by a fixed scaling factor and keeping the integer part of the result. Since the adaptation adjusts the scaled G/R mode parameter by integer steps, the actual G/R parameter behaves as if it were adapted by fractional steps. Again, this is an example of "fractional adaptation", which permits finer control of the speed of adaptation. Of course, if the G/R parameter is left unchanged (box 930) then there is no updating to perform, and the current G/R parameter is the same. Finally, the updated G/R parameter is output (box 945).

Figure 10:
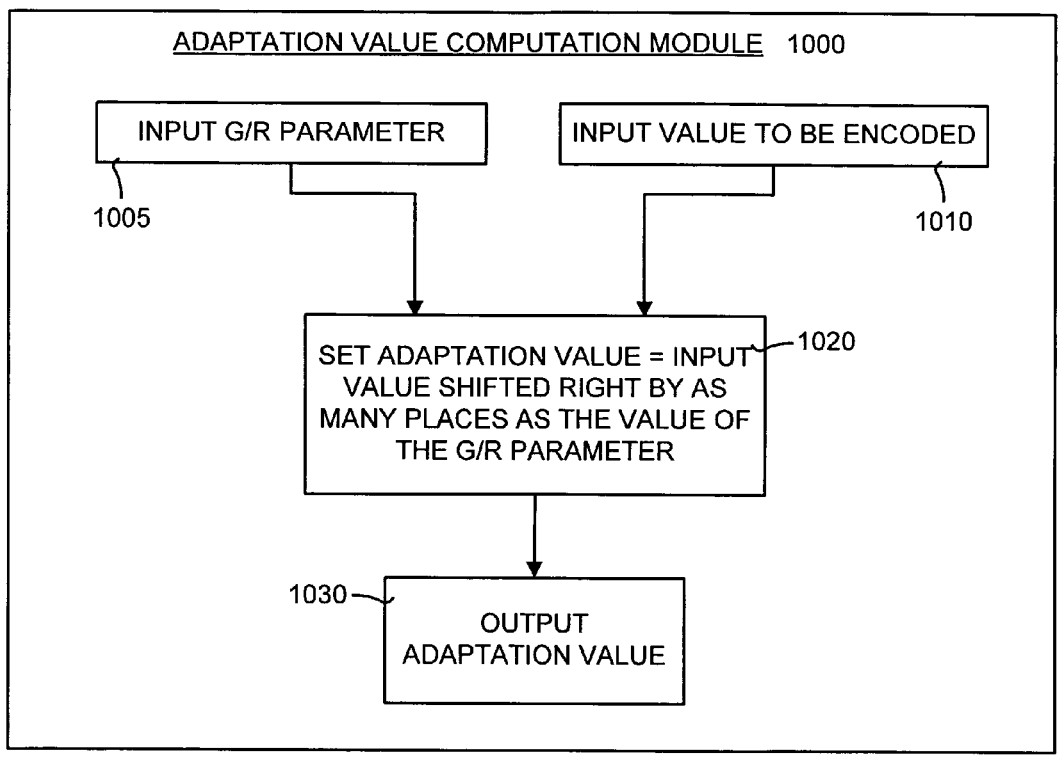
FIG. 10 is a detailed flow diagram of the computation of the adaptation value used by the Golomb/Rice (G/R) parameter adaptation module shown in FIG. 9.

FIG. 10 is a detailed flow diagram of the operation of an adaptation value computation module 1000. Referring also to FIGS. 7 and 9, the adaptation value computation module 1000 produces the adaptation value (box 910) that is an input to the flow diagram in FIG. 9. The operation begins by receiving two inputs, the current G/R parameter value (box 1005) and the input value (box 1010) to the Golomb/Rice encoders (boxes 720 and 745) of FIG. 7. Next, the input value is shifted to the right by as many places as the value of the G/R parameter (box 1020). The resulting value is the adaptation value, which then is output (box 1030).

VII. WORKING EXAMPLE

In order to more fully understand the adaptive RLGR encoder and method disclosed herein, the operational details of an exemplary working example are presented. It should be noted that this working example is only one way in which the adaptive RLGR encoder and method may be implemented.

The Run-Length Golomb/Rice (RLGR) encoder and method is an extension of the PTC entropy encoder disclosed in U.S. Pat. No. 6,477,280 cited above. However, the PTC entropy encoder of U.S. Pat. No. 6,477,280 is used for encoding binary data (typically bit-planes of integer data). The RLGR encoder and method disclosed herein can encode integer data having any input value. In other words, the adaptive RLGR encoder and method disclosed herein can encode data of any alphabet. It should also be noted that while the RLGR encoder and method described herein is more efficient when the data is likely to contain runs of zeros, it is a trivial matter to modify the encoding operations described above to account for runs of any other value that may be more likely to appear in runs.

One advantage of the RLGR encoder and method disclosed herein is that, unlike the PTC entropy encoder, there is no need to know the largest possible number of the input data. Instead, the RLGR encoder and method can handle any size input value, no matter how large. This means that the RLGR encoder assumes that the input data has a Laplacian distribution as shown in FIG. 1, and suddenly a large number appears in the input data, the RLGR encoder and method is able to encode that large number. While more bits will be used to encode that large number than a smaller number, the large number will be encoded. However, the penalty using more bits will only be paid for that large number when it occurs, and not for every other value. This is due to the new mode selection and adaptation rules set forth below.

With the PTC entropy encoder the input data is received, broken into bit planes, and then each bit plane is encoded with a G/R encoder. In the adaptive RLGR encoder and method disclosed herein, the G/R encoder is extended to the handle Laplacian data directly. This has the advantage that the adaptive RLGR encoder and method uses single-pass encoding, which makes is significantly faster than the PTC entropy encoder.

The input data of the PTC entropy encoder had a Laplacian distribution, where small numbers are more likely.

Sometimes small numbers are so much more likely that encoding runs of zeros is more efficient for a particular part of the bitstream. However, the PTC entropy encoder would pick up the data, do one pass on the most significant bit plane, and go back and do one pass in the next bit plane. For example, if the data was 16 bits, a pass was first done on bit #16 and encoded. Of course, most of the data will be zero, because that bit only gets split for very large numbers, then keeps going down. As bits #5, 4, 3, 2, and 1 are reached these bits have lots of zeros and ones, which means that it gets to a point that encoding them does not help at all. Usually the least significant bit is so random that a bit has to be used to encode the bit, that is, each input bit is directly copied to the output. The problem with the PTC entropy encoder is that encoding in bit planes requires several passes at the data. In particular, the PTC entropy encoder has to encode the most significant bit, the next bit, then the next bit, and so on. Clearly, this will take significantly more time, and in some cases the PTC entropy encoder is 1.5 to 3 times slower than the adaptive RLGR encoder and method disclosed herein.

Selecting the Encoder Mode

Figure 11:
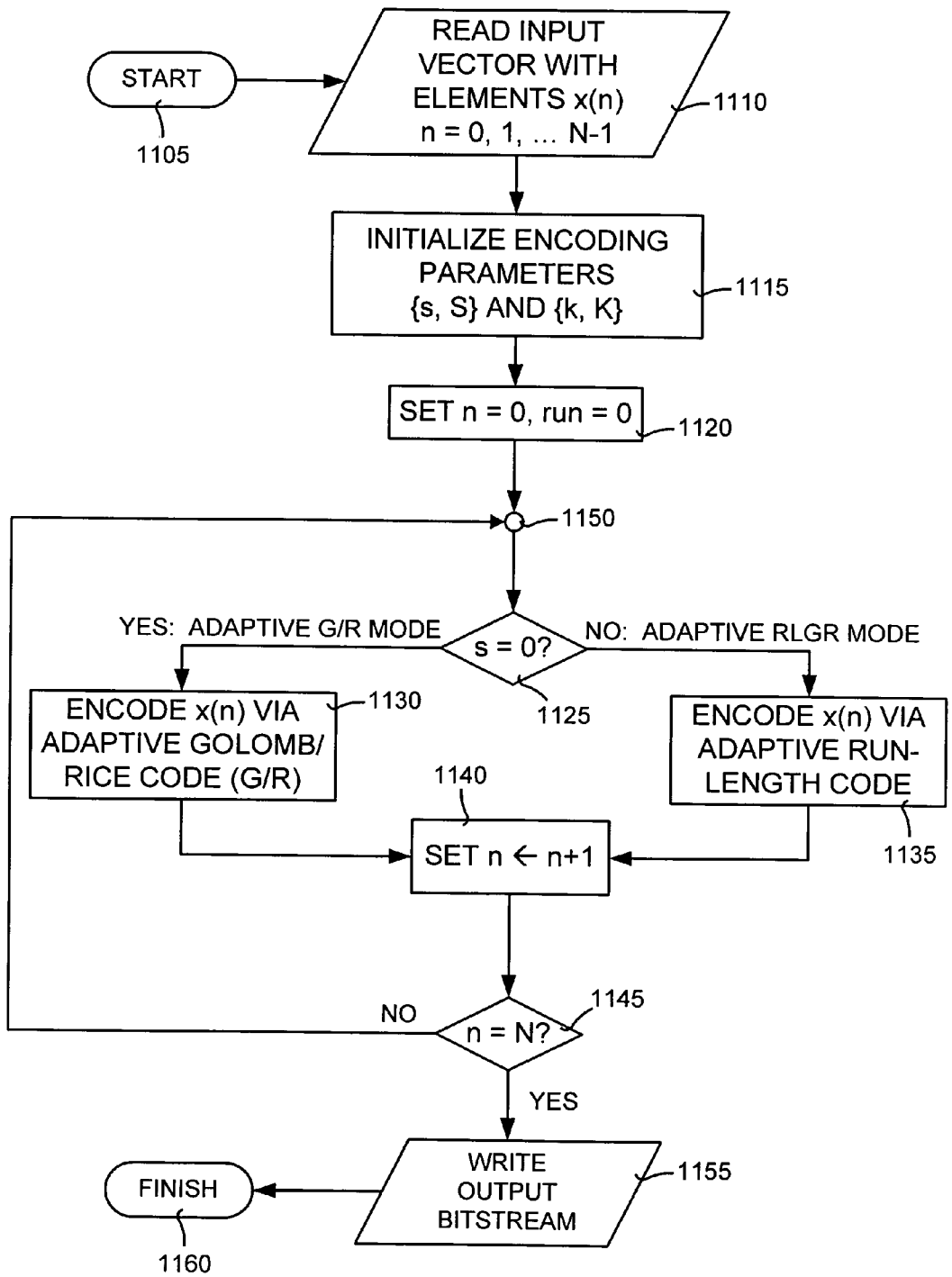
FIG. 11 is a working example illustrating the details of selecting an encoder mode for the adaptive RLGR encoder and method.

FIG. 11 is a working example illustrating the details of selecting an encoder mode for the adaptive RLGR encoder and method. The process starts (box 1105) by reading an input vector having elements x(n), where n=0, 1, . . . N−1 (box 1110). In this working example, the input vector has a probability distribution similar to the Laplacian distribution shown in FIG. 1. The probability distribution is represented by a single parameter, which is the rate of decay of the exponential. The Laplacian decay in shown in FIG. 1 goes down reasonably fast. In practice the decay typically can be either faster or slower. The faster the rate of decay, then the more likely are values equal to zero.

The adaptive RLGR encoder and method is useful for the efficient encoding of integers. Specifically, this occurs when there is a vector (or buffer) full of integer numbers that need to be encoded efficiently. Typically, the integer data will be such that small numbers are much more likely than large numbers. And if the rate of decay of the probability distribution of the data is high enough (meaning the exponential decays fast), this means that zero becomes even more likely. In this case encoding runs of zeros is a good idea.

In this working example, the input data has a probability distribution similar to the ideal shown in FIG. 1 because the data being encoded (or the input data) is not the original multimedia data. For example, in the case of an audio file, the adaptive RLGR encoder and method is not applied directly to every audio sample. Similarly, in the case of a picture file, the adaptive RLGR encoder and method is not applied to every pixel value. Instead, in many applications (including audio and image coding) there is some model of the data. This means that some predictors can be used that make reasonable guesses as to what the data should be. Thus, prediction error can be the input data, and it is the prediction error that is encoded. Prediction error is the difference between the actual value and the predicted value. Moreover, prediction errors are much more likely to be zero if the model for the data is reasonable. It is possible, however, even with a good model, to every once in a while have a large value. This can occur when a boundary is reached, such as when a pixel value goes from a background value to a foreground value. In other words, even with a probability distribution like that shown in FIG. 1, every now and then big numbers can appear. In other multimedia coding applications, the original data values (e.g. audio samples or pixels) are transformed via a transform operator, whose goal is to concentrate the information in a small number of large-valued transform coefficients, and a large number of small-valued transform coefficients. These coefficients are then quantized (rounded to nearest integers). Thus, when all quantized transform coefficients are read as a vector, the elements of that vector are more likely to contain small values, and thus are quite amenable to compression via the adaptive RLGR encoder and method disclosed herein.

In addition, the adaptive RLGR encoder and method is lossless. Lossless compression means that the input data is compressed in to a smaller size and then decoded to recover exactly the same values of the input data as the original. In contrast, lossy compression does not recover exactly the same value of original input data. Audio and video compression can use lossy compression. However, in many of these lossy compression techniques, transforms or predictors are generated for the data. The transform or predictors then are quantized, meaning that they are rounded to the nearest integer. Once these integers are obtained, lossless compression frequently is used. This means that most lossy codecs for multimedia usually have a lossless encoder portion to encode the integer values of the quantized prediction or transform operators. The adaptive RLGR encoder and method can be used to encode these integer values. Usually, each of these integer values has an associated probability distribution function (PDF). These PDFs are similar to the probability distribution of FIG. 1, in the sense that if the model is good then the prediction error should be close to zero most of the time.

Referring to FIG. 11, next the encoding parameters {s, S} and {k, K} are initialized (box 1115). The counter n and run then are set to zero (box 1120). In this working example, the s is the encoding mode parameter, S is the scaled encoding mode parameter, k is the G/R parameter, and K is the scaled G/R parameter. In general, s controls the encoding mode and how the Run-Length encoder is used, and k controls the G/R encoder. The parameter s=S/L, where L is a scaling parameter. In this working example, L is equal to 16, which is a power of 2. This allows division to be performed by merely doing a shift.

The adaptive RLGR encoder and method has two distinct encoding modes. A first encoding mode performs Golomb/Rice (G/R) encoding only, without any Run-Length encoding. This G/R only mode is applied when zero is not that much more likely in the data, such that there will not be runs of zeros that frequently. The second encoding mode performs Run-Length plus G/R encoding. This RLGR encoding mode is used when runs of zeros are so much more likely in the input data such that encoding the runs of zeros saves bits. Thus, there are two distinct encoding modes, and the adaptive RLGR encoder and method automatically selects and switches between each of the encoding modes based on the value of s, the encoding mode parameter.

A determination is made whether s equal zero (box 1125). If so, then the encoding mode is the G/R only mode. In this case, the input data x(n) is encoded using the adaptive G/R encoder (box 1130). If s equals zero, then the encoding mode is the RLGR mode. In this case, the input data x(n) is encoded using both an adaptive Run-Length encoder and an adaptive G/R encoder (box 1135). Next, n is replaced by n+1 (box 1140) and a determination is made whether n is equal to N (box 1145). If not, then the process begins again with a new x(n) (point 1150). Otherwise, the output bitstream is written (box 1155) and the process is completed for the given input data (box 1160).

Encoding Rules

The adaptive RLGR encoder and method uses novel encoding rules that are based on the encoding mode parameter, s, and the G/R parameter, k. Table 2 sets forth the coding rules for the adaptive RLGR encoder and method for mapping integer values x to a binary bitstream. As it can be seen from Table 2, code is controlled by parameters {s, k}. Parameter s controls the main mode of operation (G/R only or Run-Length+GR), and parameter k controls the G/R coder.

TABLE 2

| | | |
|---|---|---|
| s = 0 "Golomb/Rice only" mode | $x \geq 0$: u = 2 \|x\|<br>$x < 0$: u = 2 \|x\| − 1 | code = GR(u, k) |
| s > 0 "Run-Length + Golomb/Rice" mode | Run of r = $2^s$ values x = 0.<br>Run of r < $2^s$ values x = 0, followed by a value x ≠ 0. | code = 0<br>x > 0: u = 2 \|x\| − 1<br>x < 0: u = 2 \|x\| − 2<br>code = 1 + bin(r, s) + GR(u, k) |

In this working example, a mapping value, u, is defined. The input values, x, of the adaptive RLGR encoder and method can be positive or negative. The input value x is mapped to a u value, where u is only positive. Thus, the signed input value, x, is converted into an unsigned equivalent representation, U. Equation 4 sets forth the mapping from x to u. In particular, the mapping says that 0 maps to 0, 1 maps to 1, −1 maps to 2, 2 maps to 3, −2 maps to 4, and so forth, such that the u value is always positive. This is done so the G/R table (Table 1) can be used, because the G/R table is only for nonnegative values. This mapping allows the adaptive RLGR encoder and method to handle any input alphabet. In other words, because the G/R table is used (which can handle any input number), the input alphabet can be infinite and the adaptive RLGR encoder and method can handle any size number input. The adaptive RLGR encoder and method is only limited by the size of the numbers that the operating system can handle. It should be noted that in practice the G/R encoding Table 1 does not need to be stored in memory. It is easy to see that the table entries have enough structure that the codewords can be easily computed for any value of u and the encoding parameter k.

Given the u data, Table 2 states the code that goes in the channel as long as the parameters s and k are known. The rules in Table 2 precisely define how the encoder encodes, which means that the decoder can use the same rules in Table 2 to recover (or decode) the encoded data.

In the G/R only mode, which means that s=0, Table 2 states that the mapping value u of the input value x is encoded using an adaptive G/R encoder and the G/R encoding rule exemplified by Table 1. Thus, the codeword used to encode x is based on the values of u and k. The G/R parameter k is updated using a backward-adaptive technique, as discussed in detail below.

In the RLGR mode, which means that s>0, the input data is seen as a run of r values x=0. Looking at Table 2 for the RLGR mode, in one case (second row) the input data is a run of $2^s$ values of x=0. This is known as a complete run. By way of example, assume that s=3. If the input data is $2^3$=8 zeros in a row, then that run is encoded using the rules of Table 2 as a single bit equal to 0. In other words, the entire run of 8 zeros is mapped to a single bit whose value is 0. The decoder knows that if it reads a 0 it has to decode that into a string of $2^s$ zeros. In this situation, maximum compression is achieved. The overall compression achieved by the invention is an average of this RLGR mode and the G/R mode.

If the input data has a run of less than $2^s$ zeros, then the run is an incomplete run. Referring to Table 2, third row, if the input data only has, for example, 7 zeros in a row (or less than $2^s$), the codeword cannot be 0, because 0 means 8 zeros in a row or a complete run. So the codeword instead starts with a 1; this alerts the decoder that an incomplete run follows. Next, the codeword contains a binary representation of the length of the incomplete run. This binary representation uses s bits to specify the length of the incomplete run, r.

For example, assume that r=7, such that the incomplete run has 7 zeros. Then the codeword first starts with a "1" to let the decoder know that an incomplete run follows. Since in this example s=3, the length of the incomplete run can only be a number between 0 and 7 (since it only takes 3 bits to represent a number between 0 and 7). In other words, r cannot take more than s bits to be represented. So the codeword is appended to include 3 bits equal to 111 (binary 7). Now the decoder knows the run is an incomplete run and that the run length is 7 zeros.

The codeword next is appended to state what value comes immediately after the incomplete run. This value that comes after the incomplete run is represented by a codeword from the adaptive G/R encoder. As shown in Table 2, first the value after the incomplete run is mapped by using Equation 4. Then, the adaptive G/R encoder is used to obtain a G/R code that is a function of {u,k}. The bottom of the lower right block of Table 2 shows the entire codeword that is used to encode an incomplete run: code=1+bin(r,s)+GR(u,k), where bin(r,s) is the binary representation of the length of the incomplete run r represented by s bits, and GR(u,k) is the G/R code given by Table 1 that represents the value immediately following the incomplete run.

Fractional Adaptation

Fractional adaptation uses S and K instead of s and k. Fractional adaptation is a way to slow down adaptation. It is possible to use the adaptive RLGR encoder and method without fractional adaptation. However, without fractional adaptation the adaptation usually changes too quickly and typically fails to track the optimal parameters for the input data correctly.

In this working example, the adaptation of the s and k parameters is performed using the scaled S and K parameters. Thus, S and K are updated instead of s and k. The relationship between s and S and k and K is as follows: s=S/L and k=K/L, where L is a scaling parameter as explained above. Thus, when the adaptation is performed, the value of S is adapted and S is divided by L to obtain the value of s. Note that all values are integers, so by s=S/L it is meant the integer part of the result. Also recall that the fixed scaling parameter L is set to a value equal to a power of 2 (e.g. L=16), then division by L can be efficiently performed by shift operators.

Fractional adaptation is preferred because the adaptive RLGR encoder and method makes an adjustment of the parameters (s and k) for every code that is generated. In other words, after a input value or string is encoded the adaptation rules are run. If s and k are adapted directly via integer-valued changes, then because they are integer numbers, all that can be done is stay the same or increase or decrease by at least 1. However, suppose the input data is getting bigger, meaning that the parameters should be increased. If s is increased, say, by 1, which could be too much. For example, if s=3, then runs of 8 zeros are being encoded. To increase s by 1, s would then equal 4, which means that now runs of 16 zeros are being encoded via a single codeword=0. That jumped from 8 to 16 could be a little large. When the next string is encoded, it would find s to be too big, and decrease s to 3. However, this may be too small, and s would be oscillating.

Fractional adaptation allows a fractional increment of s. For example, s could be increased by 0.5 instead of 1. However, this is not allowed, because s is an integer parameter. So fractional adaptation performs an integer increment in S, and divides S by L to give an fractional increment of s. For example, suppose that L=16, s=3, which means that S=48. Assume that the input data becomes much smaller, so that S should be increased. The next time S is increased from 48 to 52, when dividing by 16, s is still 3, but S is 52. If another small input data comes up, S could be increased from 52 to 64, and when S=64 then s=4. Thus, instead of bumping s to 4 immediately just because a smaller input data came up, it took two times seeing a decrease in the value of the input data to go from s=3 to s=4. This ensures that there is no oscillation in the parameters s and k.

Instead of using fractional adaptation it is possible to define a flag such that if there is a decrease or increase in the data then a certain number of encoding cycles passes before increasing or decreasing the parameters. A new parameter could be defined that keeps track of the number of encoding cycles. In other words, the parameter would keep track of how many times that the condition (input data increasing or decreasing) should happen before the parameters are changed. It should be noted, however, that this technique was tried, and the fractional adaptation provided superior results.

Encoding Mode (s) Parameter Adaptation

The encoding mode parameter s is adapted after each input value or string is encoded. When fractional adaptation is used, the fractional encoding mode parameter S is actually adapted, instead of s directly. Table 3 sets forth the adaptation rules for the encoding mode parameter s. After adaptation, the value of s is set to s=S/L, where L is the scaling parameter. In this working example, L was equal to a power of two such that division was be implemented by a right shift. In this working example, L=16.

TABLE 3

| | | |
|---|---|---|
| s = 0 "Golomb/Rice only" mode | $|x| = 0 : S \leftarrow S + A1$ $|x| > 0 : S \leftarrow S - B1$ | |
| s > 0 "Run-Length + Golomb/Rice" mode | Run of r = $2^s$ values x = 0. Run of r > $2^s$ values x = 0, followed by a value x ≠ 0. | $S \leftarrow S + A2$ $S \leftarrow S - B2$ |

In Table 3 at the top, the rules for s adaptation are given when the encoder is in the G/R only mode. If the magnitude of the symbol to be encoded x equals 0, then the parameter s is increased by a first integer constant called A1. The leftward pointing arrow (←) means that S is replaced by S+A1. If the absolute value of x is greater than 0, then the parameter s is decreased by a second integer constant called B1. The integer constants A1 and B1 are increments and decrements that say how much s should be adjusted either up or down.

In Table 3 at the bottom, the rules for the adaptation of s are given when the encoder in is the RLGR mode. If the run is a complete run, meaning that the run contains $2^s$ values of x=0, then the parameter s is increased by a third integer constant, A2. However, if the run is a partial run, meaning that the run contains less than $2^s$ number of zeros, followed by a x value that is not zero, then the parameter s is decreased by an fourth integer constant, B2. Using these adaptation rules, the parameter s (or S, if fractional adaptation is being used) is updated after each input value or string is encoded.

By using the adaptation rules contained in Table 3, a probability model for the input data is being implicitly measured. In fact, instead of first measuring probabilities and then trying to adapt the parameters, instead the parameters are being changed directly. In this working example, the following values were found to achieve excellent results: L=16, A1=3, B1=3, A2=4, B2=6 and B3=2. If appropriate values of A1, B1, A2 and B2 are used, then it has be observed that the adaptive RLGR encoder and method will actually track changes in the statistics of the input data faster than the prior art. This is because the prior art first measures the whole statistical model and then adjusts parameters, such as the G/R parameter. The prior art does this because in order to compute reasonable probability estimates a significant amount of data is needed. The only data available are the values decoded currently and the values decoded before. This means to be precise in a probability estimate, a significant amount of data must be used before a probably estimate can be made and a G/R parameter found. This means there will be a delay in the coding process. For example, if an audio file is being encoded, then there is a delay in detecting any changes in the input data. This means that the G/R parameter is mismatched with the input data for a period of time. In other words, the adaptation rules set forth in Table 3 (for the s parameter) and in Table 4 below (for the k parameter) are much faster, and adapts to the statistics of the input data much quicker, than prior art methods. In fact, this is a big advantage over the prior art, namely, fast adaptation to the statistics of the input data.

Golomb/Rice Only Mode

Figure 12:
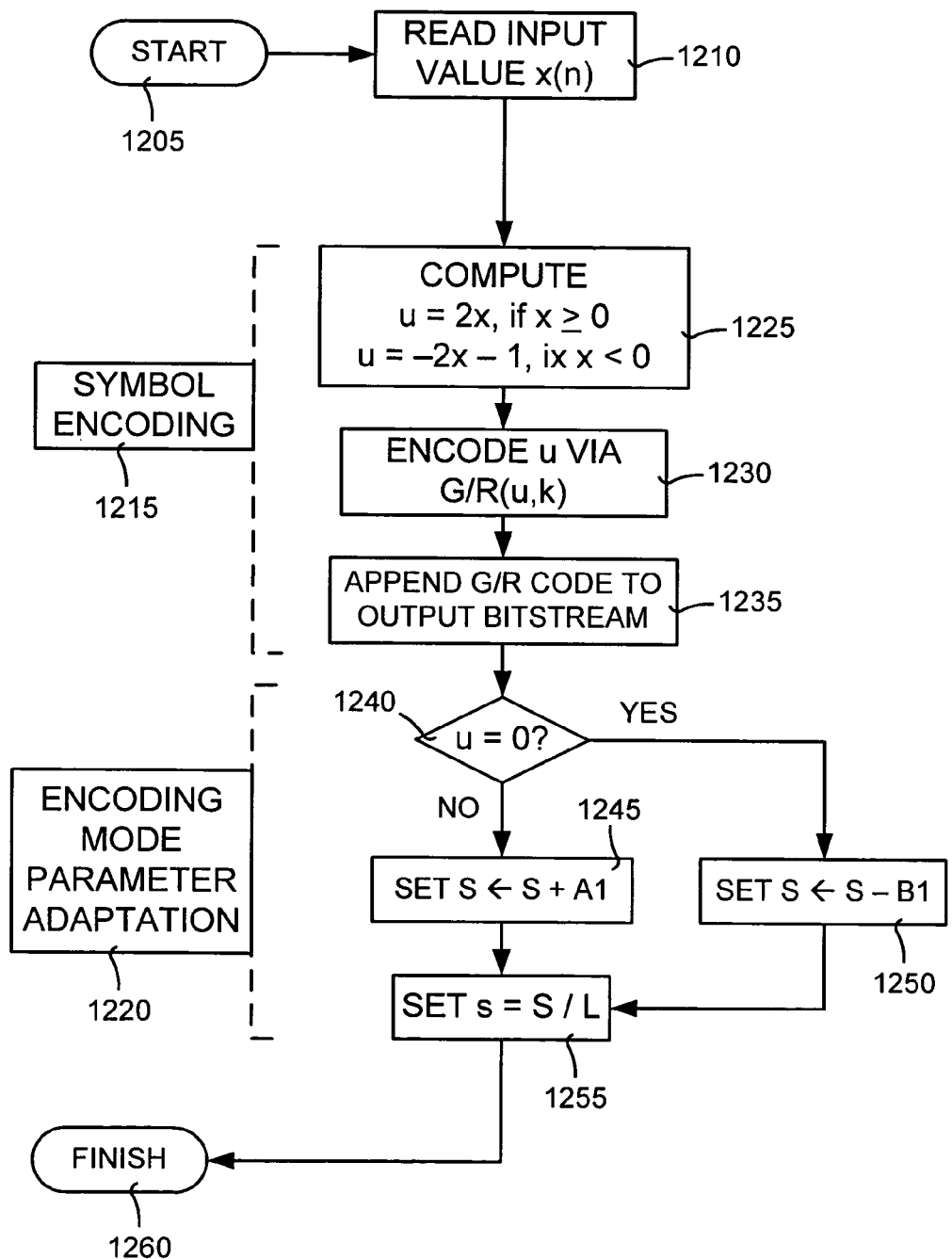
FIG. 12 is a working example illustrating the encoding details of the G/R only mode and the accompanying encoding mode parameter s adaptation.
Figure 14:
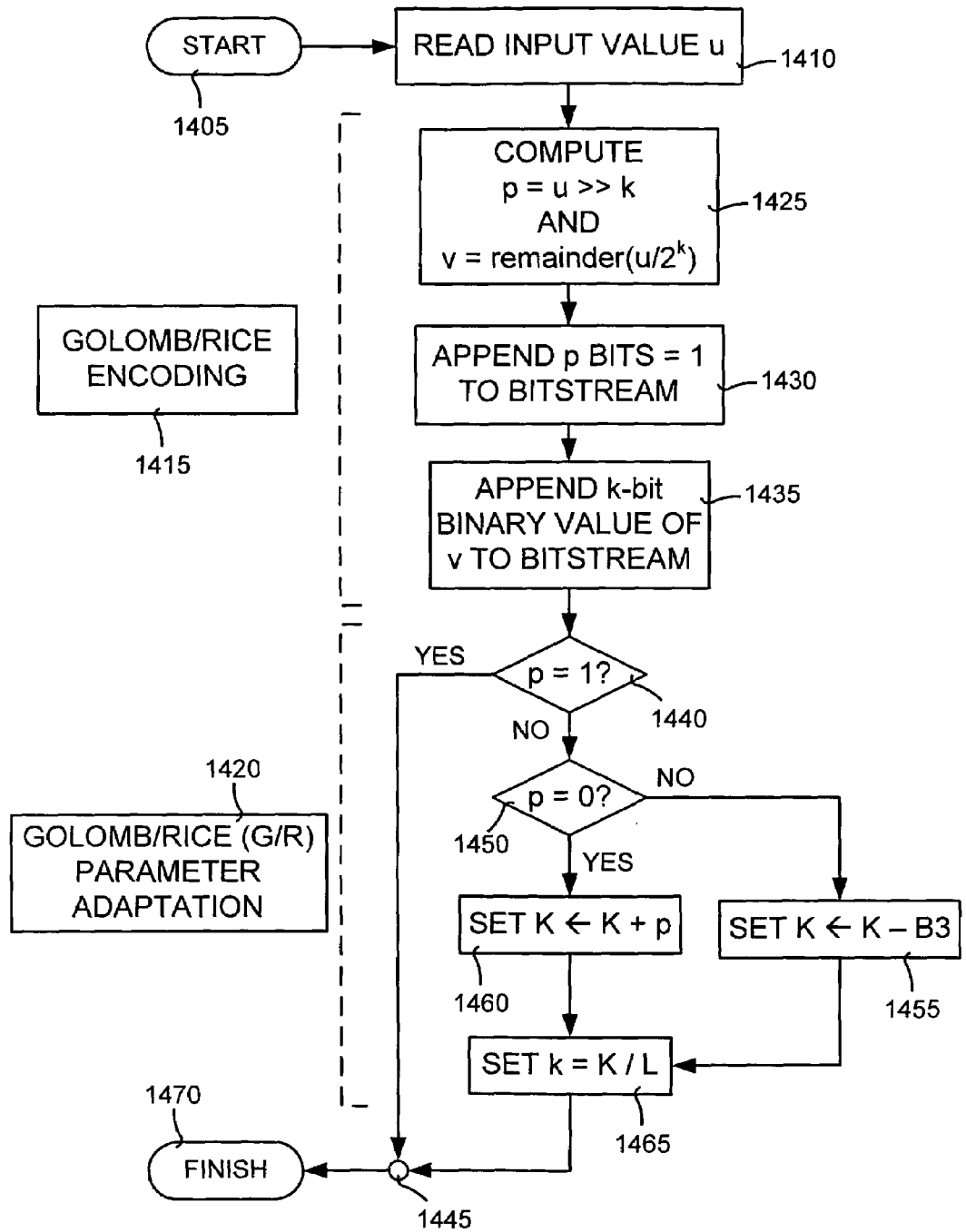
FIG. 14 is a working example illustrating the encoding details of the adaptive G/R only mode and as when as the G/R parameter k adaptation rules.

FIG. 12 is a working example illustrating the encoding details of the G/R only mode and the accompanying encoding mode parameter s adaptation. The process begins (box 1205) by reading the input vector x(n) (box 1210). The two main processes of the G/R only mode are Symbol Encoding (box 1215) and Encoding Mode Parameter Adaptation (box 1220). The Symbol Encoding process begins by defining the mapping value u (box 1225), as shown in Table 2 for the G/R only mode. Next, the input value is encoded using the adaptive G/R encoder (box 1230). It should be noted that the adaptive G/R encoder uses G/R parameter k adaptation, as shown in FIG. 14. The Symbol Encoding process ends by appending the G/R code to the output encoding bitstream (box 1235).

The Encoding Mode Parameter Adaptation process begins by determining whether the value of u equals zero (box 1240). If not, then S is updated and replaced by S increased by the first integer constant, A1 (box 1245). If u is not equal to zero, then S is updated and replaced by S decreased by the second integer constant, B1 (box 1250). Finally, s is set equal to S divided by L (box 1255), and the process is finished (box 1260).

RLGR Mode

Figure 13:
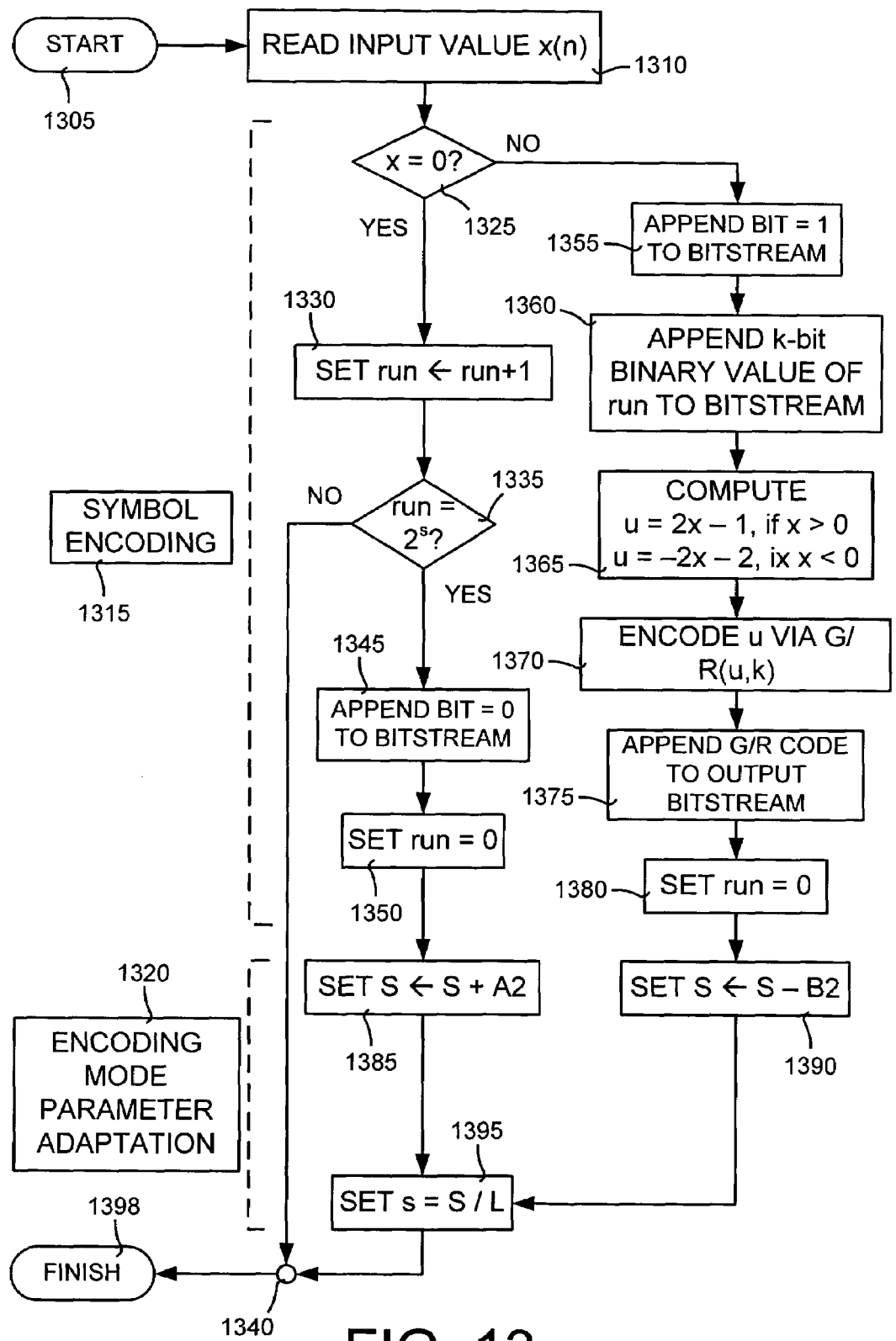
FIG. 13 is a working example illustrating the encoding details of the RLGR mode and the accompanying encoding mode parameter s adaptation.

FIG. 13 is a working example illustrating the encoding details of the RLGR mode and the accompanying encoding mode parameter s adaptation. The process begins (box 1305) by reading the input vector x(n) (box 1310). Once again, the two main processes of the RLGR mode are Symbol Encoding (box 1315) and Encoding Mode Parameter Adaptation (box 1320). This time, however, the Symbol Encoding process uses an adaptive Run-Length encoder and an adaptive G/R encoder to encode the input value x(n).

The Symbol Encoding process begins by determining whether the value of x equals zero (box 1325). If so, then the run is replaced with run+I (box 1330). Next, a determination is made whether run=$2^s$ (box 1335). In other words, is the run a complete run or an incomplete run. If the run is an incomplete run, then the process is finished (point 1340). If the run is a complete run, then the bit=0 is appended to the bitstream (box 1345). The value of run then is set equal to zero (box 1350).

If the value of x is not equal to zero (box 1325), then the bit=1 is appended to the bitstream (box 1355). Next, an s-bit binary value of run (or the length of the incomplete run represented by s bits) is appended to the bitstream (box 1360). The value after the incomplete run then is encoded using the adaptive G/R encoder. In particular, the mapping value u is defined (box 1365), the value is encoded using the adaptive G/R encoder, and the G/R is appended to the bitstream (box 1370). Once again, it should be noted that the adaptive G/R encoder uses G/R parameter k adaptation, as shown in FIG. 14. The Symbol Encoding process ends by setting run equal to zero (box 1380).

The Encoding Mode Parameter Adaptation process updates and replaces S with S increased by the third integer constant, A2 (box 1385), if the value of x is equal zero (box 1325). If the value of x is not equal to zero (box 1325), then S is updated and replaced with S decreased by the fourth integer constant, B2 (box 1390). Finally, the process sets s equal to S divided by L (box 1395) and the process finishes (box 1398). As mentioned before, division by L can be implemented via a shift operation, if the value of L is chosen as a power of two.

Golomb/Rice (k) Parameter Adaptation

The G/R parameter k is adapted after each input value or string is encoded. When fractional adaptation is used, the scaled G/R parameter K is actually adapted, instead of k directly. Table 4 sets forth the adaptation rules for the G/R parameter k. After encoding a value u, the adaptation is controlled by the adaptation value of p=u>>k, meaning that u is shifted to the right k places. After adaptation, the value of k is set to k=K/L, where L is a constant. In this working example, L=16.

TABLE 4

| | |
|---|---|
| p = 0 | decrease K by setting K ← K − B3 |
| p = 1 | no change |
| p > 1 | increase K by setting K ← K + p |

The G/R code from Table 1 depends on the parameter k. For example, if the value after an incomplete run is 13, the GR code for 13 is "1111111111110" (for k=0) and if k=1 it is "11111101". The larger k is, the smaller the number representing 13 will be. And the smaller k is, the larger the number representing 13 will be. Thus, the parameter k must be known. This means that the adaptive RLGR encoder and method can do a good job if it chooses a good value for s and for k. However, it is not always advantageous to use large values of k because it will produce longer strings for smaller values of the input data, as shown in Table 1. In other words, a good choice for the value of k depends on the input data. If the value is 13, then using a large value of k is a good idea. However, suppose that the value after the incomplete run is "1". Then, smaller value of k is desirable. Thus, for small values after the incomplete run, it is better to use a small k, and for large values it is better to use a large k. Thus, the choice of k is related to the probability of the values. In the prior art there is a body of theoretical work to this effect: the probability for the input data is known (for example, if the input data is Laplacian where there is a single parameter than controls the decay), there are well-known formulas that from that decay parameter the parameter k to be used can be computed. This gives on average the mapping to use as few bits as possible.

Thus, it is important for the k parameter to be adaptive. That way, if on the input data there are big values coming up, k should be increased, because for big values larger k is better. On the other hand, if there are smaller values coming up, k should be decreased. Instinctively, it can be seen that for big numbers k should be increased and for small numbers k should be decreased. Then as long as k is changed at a small enough pace (such as when using fractional adaptation), the optimal parameters for the input data will always be tracked correctly.

The adaptation rules for k shown in Table 4 are significantly new. In the adaptive RLGR encoder and method, any value can come after the incomplete runs of zeros, so this value must be encoded. The encoding is done using the adaptive G/R encoder and the G/R parameter k. Referring to Table 4, the input data is x. The input data x can be any integer number, small x's are more likely (can be positive or can be negative). However, G/R encoding is only for positive numbers. A straightforward mapping of x is used (see equation 4) to map x into u. The adaptation of k is controlled by the adaptation value p, which is defined as u shifted to the right k places. Thus, the adaptation value p is a scaled down version of u. Or, equivalently, the p parameter is an integer approximation to $U/2^k$. Shifting k places to the right is equivalent to dividing the number by $2^k$. For example, if a number is shifted 5 bits to the right this is the same as dividing the number by 32 (or $2^5$). The remainder is thrown away, and just the quotient is used.

Referring to Table 4, if the adaptation value p is equal to zero, then K is updated and replaced by K decreased by the fifth integer constant, B3. If the adaptation value p is equal to one, then K is unchanged. If the adaptation parameter p is greater than one, then K is updated and replaced by K decreased by the adaptation value p.

If the adaptation value of p is equal to one, it means that the value of u was close to $2^k$, and those are the kinds of values for which the parameter k is correct. Thus, as shown in Table 4, there is no change. If the value of the adaptation value p is 0, which means that the input value was smaller than $2^k$. This means it is time to start decreasing k (because the input values are smaller than $2^k$). The case where the adaptation value p is greater than 1 is much less likely because the input values are not likely to be very big. But if the numbers are big and p>1, then it is time to start increasing the k parameter.

Adaptive G/R Encoder

FIG. 14 is a working example illustrating the encoding details of the adaptive G/R encoding module, including the G/R parameter k adaptation rules. It should be noted that the k adaptation is used in both the G/R only mode and the RLGR mode but is not shown in FIGS. 12 and 13 to avoid cluttering the drawings. The process begins (box 1405) by reading the input value u (box 1410). The two main processes of the adaptive G/R mode are G/R Encoding (box 1415) and G/R Parameter Adaptation (box 1420).

The G/R Encoding process begins by computing an adaptation value p and v (box 1425). The bitstream is appended with p bits equal to one (box 1430). The k-bit binary value of v then is appended to the bitstream (box 1435). These operations comprise the Golomb/Rice encoder as defined in Table 1.

The G/R Parameter Adaptation process includes determining whether the adaptation value p is equal to one (box 1440). If so, then the adaptation value p is left unchanged (point 1445). Otherwise, another determination is made whether the adaptation value p equals zero (box 1450). If not, then K is updated and replaced by K decreased by the fifth integer constant, B3 (box 1455). Otherwise, K is updated and replaced by K increased by the adaptation value p (box 1460). Finally, the process sets k equal to K divided by L (box 1465) and the process finishes (box 1470).

Results

The RLGR encoder and method of this working example has been implemented in applications for image, audio, and map data compression. The results of using the RLGR encoder and method in these applications have been compression ratios that are comparable to the most sophisticated entropy coders, but in a simpler implementation.

In particular, with respect to existing entropy encoders for integer data, the RLGR encoder and method achieves compression rates near the theoretical maximum (dictated by the source entropy) for a large class of source symbol probability distributions, like the one in FIG. 1. By way of example, well-known Golomb-Rice and Huffman encoders are efficient only for source entropies of 1 bit per symbol or higher.

VIII. Decoding

The adaptive RLGR codec and method also includes a decoder that can be precisely implemented based on the encoder description above. Referring to FIG. 2B, a computing device (box 250) can implement just an RLGR decoder 240. An adaptive RLGR decoder 240 and method receives codewords from an encoded bitstream (box 230). Next, the adaptive RLGR decoder 240 decodes the codewords by applying the reverse rules corresponding to those in the G/R-only mode or the RLGR mode. Next, the encoding mode and G/R parameters are adapted using exactly the same rules as those for the encoder (described above). Finally, the decoded (reconstructed) integer data is output (box 260).

Since the encoding rules are uniquely decodable and the adaptation rules for the decoder are identical to those of the encoder, the previous descriptions of the encoding rule and adaptation rules also describe precisely the operations of the decoder.

The foregoing description of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description of the invention, but rather by the claims appended hereto.

What is claimed is:

1. A method for encoding digital data, comprising:
selecting between a first encoding mode and a second encoding mode to encode the digital data into an encoded bitstream, the first mode using a first type of entropy encoder other than a Run-Length encoder and the second mode using the first type of entropy encoder combined with the Run-Length encoder; and
adapting the encoders of the first mode and the second mode based on the encoded bitstream using a backward-adaptive technique.

2. The method as set forth in claim 1, wherein the first type of entropy encoder is a Golomb/Rice encoder that combines with the Run-Length encoder in the second mode to generate a Run-Length Golomb/Rice (RLGR) encoder.

3. The method as set forth in claim 2, further comprising using an encoding mode parameter to select between the first and second modes.

4. The method as set forth in claim 3, further comprising encoding in the first mode if the encoding mode parameter equals zero.

5. The method as set forth in claim 4, further comprising updating the encoding mode parameter, comprising:
adding a first integer constant to the encoding mode parameter if the absolute value of the digital data is approximately zero; and
subtracting a second integer constant from the encoding mode parameter if the absolute value of the digital data is greater than zero.

6. The method as set forth in claim 2, further comprising updating a Golomb/Rice parameter, comprising:
defining an adaptation value in terms of the Golomb/Rice parameter;
decreasing the Golomb/Rice parameter by a third integer constant if the adaptation value equals zero;
leaving the Golomb/Rice parameter unchanged if the adaptation value equals one; and
increasing the Golomb/Rice parameter by the adaptation value if the adaptation value is greater than one.

7. The method as set forth in claim 3, further comprising encoding in the second mode if the encoding mode parameter is greater than zero.

8. The method as set forth in claim 7, further comprising:
defining adjacent zero values in the digital data as a run;
defining a complete run as a run having a number of zero values equal to 2 raised to the power of the encoding mode parameter; and
encoding the complete run using the Run-Length encoder.

9. The method as set forth in claim 8, further comprising representing the complete run as a codeword equal to zero.

10. The method as set forth in claim 8, further comprising:
defining an incomplete run as a run having a number of zero values equal to less than two raised to the power of the encoding mode parameter and followed by a value not equal to zero;
encoding the incomplete run by:
placing a value of one at the beginning of a codeword representing the incomplete run;
representing a length of the incomplete run in the codeword; and
representing a value of the digital data following the incomplete run using the Golomb/Rice encoder.

11. The method as set forth in claim 8, further comprising updating the encoding mode parameter by adding a fourth integer constant to the encoding mode parameter.

12. The method as set forth in claim 8, further comprising updating a Golomb/Rice parameter, comprising:
defining an adaptation value in terms of the Golomb/Rice parameter;
decreasing the Golomb/Rice parameter by a fifth integer constant if the adaptation value equals zero;
leaving the Golomb/Rice parameter unchanged if the adaptation value equals one; and
increasing the Golomb/Rice parameter by the adaptation value if the adaptation value is greater than one.

13. The method as set forth in claim 10, further comprising updating the encoding mode parameter by subtracting a fifth integer constant from the encoding mode parameter.

14. The method as set forth in claim 10, further comprising updating a Golomb/Rice parameter, comprising:
defining an adaptation value in terms of the Golomb/Rice parameter;
decreasing the Golomb/Rice parameter by a fifth integer constant if the adaptation value equals zero;
leaving the Golomb/Rice parameter unchanged if the adaptation value equals one; and
increasing the Golomb/Rice parameter by the adaptation value if the adaptation value is greater than one.

15. The method as set forth in claim 2, further comprising adapting the encoders of the first mode and the second mode after every codeword that is generated.

16. A computer-readable medium having computer-executable instructions for performing the method recited in claim 1.

17. A computer-implemented process for encoding digital integer data, comprising:
switching between a first encoder mode performing Golomb/Rice (G/R) encoding only and a second encoder mode performing Run-Length encoding and G/R encoding;
defining an encoding mode parameter s to control which of the first and second encoder modes is used; and
updating the encoding mode parameter s after each codeword is generated using a backward-adaptive technique.

18. The computer-implemented process of claim 17, further comprising:
defining a Golomb/Rice (G/R) parameter k to control the G/R encoding of both the first and the second encoding modes; and
updating the G/R parameter k after each codeword is generated using a backward-adaptive technique.

19. The computer-implemented process of claim 18, further comprising switching to the first encoding mode if s=0.

20. The computer-implemented process of claim 19, further comprising encoding an input value x of the digital integer data using an adaptive G/R encoder having the G/R parameter k.

21. The computer-implemented process of claim 20, further comprising:
determining whether |x|=0;
if so, then increasing s by a first integer constant, A1; and
if not, then decreasing s by a second integer constant, B1.

22. The computer-implemented process of claim 21, further comprising:
defining an adaptation value, p;
decreasing k by a fifth integer constant if p=0;
leaving k unchanged if p=1; and
increasing k by the adaptation value if p>0.

23. The computer-implemented process of claim 18, further comprising switching to the second encoding mode if s>0.

24. The computer-implemented process of claim 23, further comprising:
defining a run r as a string of adjacent zeros in the digital integer data;
designating a run r as a complete run if $r=2^s$; and
designating a run r as an incomplete run if $r<2^s$.

25. The computer-implemented process of claim 24, further comprising using Run-Length encoding to encode a complete run as a codeword=0.

26. The computer-implemented process of claim 24, further comprising using Run-Length encoding to encode an incomplete run as a codeword=1.

27. The computer-implemented process of claim 26, further comprising appending to the codeword a binary value having s number of bits to represent a length of the incomplete run r.

28. The computer-implemented process of claim 27, further comprising:
using adaptive G/R encoding having the G/R parameter k to encode a value immediately following the incomplete run; and
appending the encoded value to the codeword.

29. The computer-implemented process of claim 24, further comprising:
increasing s by a third integer constant, A2, if the run r is a complete run; and
decreasing s by a fourth integer constant, B2, if the run r is an incomplete run.

30. The computer-implemented process of claim 23, further comprising:
defining an adaptation value, p;
decreasing k by a fifth integer constant if p=0;
leaving k unchanged if p=1; and
increasing k by the adaptation value if p>0.

31. The computer-implemented process of claim 18, further comprising:
defining a scaling parameter, L;
defining a scaled encoding mode parameter as S=s multiplied by L;
defining a scaled G/R parameter as K=k multiplied by L; and
updating the scaled encoding mode parameter S and the scaled G/R parameter K instead of s and k after each codeword is generated using the backward-adaptive technique and adaptation rules.

32. A computer-readable medium having computer-executable instructions for performing the computer-implemented process recited in claim 17.

33. A method for encoding digital integer data having integer values, comprising:
receiving an input string x of the digital integer data;
using an encoding mode parameter s to select between using one of the following: (a) a first mode that uses an adaptive Golomb/Rice (G/R) encoder only; (b) a second mode that uses an adaptive Run-Length encoder and the adaptive G/R encoder;
defining a scaled encoding mode parameter as S=s*L, where L is a scaling parameter;
using a scaled G/R parameter K in the adaptive G/R encoder of the first and the second modes; and
updating the scaled encoding mode parameter S and the scaled G/R parameter K using a backward-adaptive technique.

34. The method of claim 33, further comprising:
encoding the input string in the first mode if s=0;
increasing S by a first integer constant, A1, if |x|=0; and
decreasing S by a second integer constant, B1, if |x|>0.

35. The method of claim 33, further comprising:
encoding the input string in the second mode if s>0;
increasing S by a third integer constant, A2, if x contains a run r of zeros such that $r=2^s$; and
decreasing S by a fourth integer constant, B2, if x contains a run r of zeros such that $r<2^s$.

36. The method of claim 35, further comprising:
defining an adaptation value, p;
decreasing K by a fifth integer constant, B3, if p=0;
leaving K unchanged if p=1; and
increasing K by p if p>1.

37. An adaptive Run-Length and Golomb/Rice (RLGR) encoder for encoding digital integer data containing integer values, comprising:
- a Golomb/Rice (G/R) encoder for encoding the integer values;
- a Run-Length encoder for encoding the integer values;
- a means for using an encoding mode parameter s to switch between a first mode containing the G/R encoder only and a second mode containing both the Run-Length encoder and the G/R encoder; and
- a means for updating the encoding mode parameter s using a backward adaptive technique having adaptation rules.

38. The adaptive RLGR encoder as set forth in claim 37, further comprising:
- a Golomb/Rice (G/R) parameter k for encoding the integer values using the G/R encoder of both the first and second modes;
- a means for updating the G/R parameter k using the backward adaptation technique having the adaptation rules.

39. The adaptive RLGR encoder as set forth in claim 38, wherein the adaptation rules further comprise:
- a means for updating the encoding mode parameters s as follows:
    - increasing s by a first integer constant, A1, if s=0;
    - decreasing s by a second integer constant, B1, if s>0;
    - increasing s by a third integer constant, A2, if a run r of zeros is a complete run such that $r=2^s$;
    - decreasing s by a fourth integer constant, B2, if a run r of zeros is an incomplete run such that $r<2^s$; and
- a means for updating the G/R parameter k as follows:
    - defining an adaptation value, p;
    - decreasing k by a fifth integer constant if p=0;
    - keeping k the same if p=1;
    - increasing k by p if p>1.

40. The adaptive RLGR encoder as set forth in claim 39, further comprising:
- a means for defining a scaled encoding mode parameter S and a scaled G/R parameter K, as follows:
    - defining a scaling parameter, L;
    - defining S=s*L;
    - defining K=k*L; and
- a means for updating S and K instead of s and k using the respective adaptation rules.

* * * * *

UNITED STATES PATENT AND TRADEMARK OFFICE
CERTIFICATE OF CORRECTION

PATENT NO. : 6,987,468 B1
APPLICATION NO. : 10/978157
DATED : January 17, 2006
INVENTOR(S) : Henrique S. Malvar It is certified that error appears in the above-identified patent and that said Letters Patent is hereby corrected as shown below:

On the Title pg, Item (56), under "Other Publications", line 7, after "Jr." insert -- , --.

On the Title pg, Item (56), under "Other Publications", line 8, delete "alorithm" and insert -- algorithm --, therefor.

On the Title pg, Item (56), under "Other Publications", line(s) 2-3, delete "distrbutions" and insert -- distributions --, therefor.

On Sheet 12 of 14, Fig. 12 (Box 1225), line 3, delete "ix" and insert -- if --, therefor.

On Sheet 13 of 14, Fig. 13 (Box 1365), line 3, delete "ix" and insert -- if --, therefor.

In column 2, line 8, delete "0" and insert -- $\theta$ --, therefor.

In column 2, line 49, after " $u = Q(x) = \begin{cases} 2x, & x \geq 0 \\ -2x-1 & x < 0 \end{cases}$ " insert -- } --.

In column 4, line 67, delete "0" and insert -- $\theta$ --, therefor.

In column 8, line 22, after "values" insert -- s --.

In column 9, line 52, after "FIG. 4" insert -- . --.

In column 10, line 36, after "codecs" delete "," and insert -- . --, therefor.

In column 21, line 27, delete "U" and insert -- u --, therefor.

In column 22, line 1, delete "$2^5$" and insert -- $2^s$ --, therefor.

In column 23 (Table 3), line 48, delete "$r > 2^s$" and insert -- $r < 2^s$ --, therefor.

In column 25, line 3, delete "run+l" and insert -- run + 1 --, therefor.

In column 26, line 32, delete "$U/2^k$" and insert -- $u/2^k$ --, therefor.

UNITED STATES PATENT AND TRADEMARK OFFICE
CERTIFICATE OF CORRECTION

PATENT NO. : 6,987,468 B1
APPLICATION NO. : 10/978157
DATED : January 17, 2006
INVENTOR(S) : Henrique S. Malvar It is certified that error appears in the above-identified patent and that said Letters Patent is hereby corrected as shown below:

In column 29, line 58, in Claim 24, delete "ras" and insert -- r as --, therefor.

Signed and Sealed this

Twenty-eighth Day of July, 2009

JOHN DOLL
*Acting Director of the United States Patent and Trademark Office*